US012010882B2

(12) United States Patent
Cho et al.

(10) Patent No.: US 12,010,882 B2
(45) Date of Patent: Jun. 11, 2024

(54) DISPLAY DEVICE

(71) Applicant: Samsung Display Co., Ltd., Yongin-si (KR)

(72) Inventors: Young Jin Cho, Seoul (KR); Ji Su Na, Yongin-si (KR); Joong Soo Moon, Hwaseong-si (KR); Yang Wan Kim, Hwaseong-si (KR); Chang Kyu Jin, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 246 days.

(21) Appl. No.: 16/917,669

(22) Filed: Jun. 30, 2020

(65) Prior Publication Data

US 2021/0111239 A1    Apr. 15, 2021

(30) Foreign Application Priority Data

Oct. 14, 2019   (KR) ......................... 10-2019-0126756

(51) Int. Cl.
*H10K 59/131* (2023.01)
*H01L 27/12* (2006.01)
(Continued)

(52) U.S. Cl.
CPC ....... *H10K 59/131* (2023.02); *H01L 27/1237* (2013.01); *H01L 27/124* (2013.01);
(Continued)

(58) Field of Classification Search
CPC ............... H01L 27/124; H01L 27/3276; H01L 27/3262; H01L 27/1244; H01L 27/3279;
(Continued)

(56) References Cited

U.S. PATENT DOCUMENTS

2016/0284267 A1* 9/2016 Gil ...................... G09G 3/3233
2018/0108724 A1* 4/2018 Lee ..................... H01L 27/3279
(Continued)

FOREIGN PATENT DOCUMENTS

| CN | 110703523 A | * | 1/2020 | ....... G02F 1/134309 |
| EP | 3486948 A1 | * | 5/2019 | ........... G09G 3/3258 |
| KR | 20160091525 A | * | 8/2016 | |

*Primary Examiner* — Yu Chen
(74) *Attorney, Agent, or Firm* — Lewis Roca Rothgerber Christie LLP

(57) ABSTRACT

A display device includes a signal line extending in a first direction, a first transistor configured to control a driving current, a light-emitting element electrically coupled to a second electrode of the first transistor, a second transistor electrically coupled to a first electrode of the first transistor and configured to transfer a data voltage, a first scan line electrically coupled to a gate electrode of the second transistor and extending in the first direction, a third transistor including a first electrode electrically coupled to the second electrode of the first transistor and a second electrode electrically coupled to a gate electrode of the first transistor and a second scan line electrically coupled to a gate electrode of the third transistor and extending in the first direction, wherein the second scan line overlaps one selected from among the signal line and the first scan line.

12 Claims, 15 Drawing Sheets

(51) Int. Cl.
*H01L 29/786* (2006.01)
*H10K 59/124* (2023.01)
*H10K 59/126* (2023.01)

(52) U.S. Cl.
CPC ..... *H01L 29/78672* (2013.01); *H10K 59/124* (2023.02); *H10K 59/126* (2023.02)

(58) Field of Classification Search
CPC .............. H01L 27/3288; H01L 27/329; H01L 29/78648; G02F 1/136286; G02F 1/13624; G02F 1/1368; G02F 1/13685; G02F 1/136209; G02F 1/1329; G09G 3/3225; G09G 3/3266; H10K 59/131; H10K 59/1315; H10K 59/179; H10K 59/1795

See application file for complete search history.

(56) References Cited

U.S. PATENT DOCUMENTS

| | | | |
|---|---|---|---|
| 2019/0006390 A1* | 1/2019 | Park | H01L 27/1218 |
| 2019/0115407 A1* | 4/2019 | Cho | H10K 59/131 |
| 2019/0115415 A1* | 4/2019 | Choi | G09G 3/3291 |
| 2019/0147799 A1* | 5/2019 | Kim | H01L 27/3246 |
| | | | 345/55 |

* cited by examiner

Fig. 1
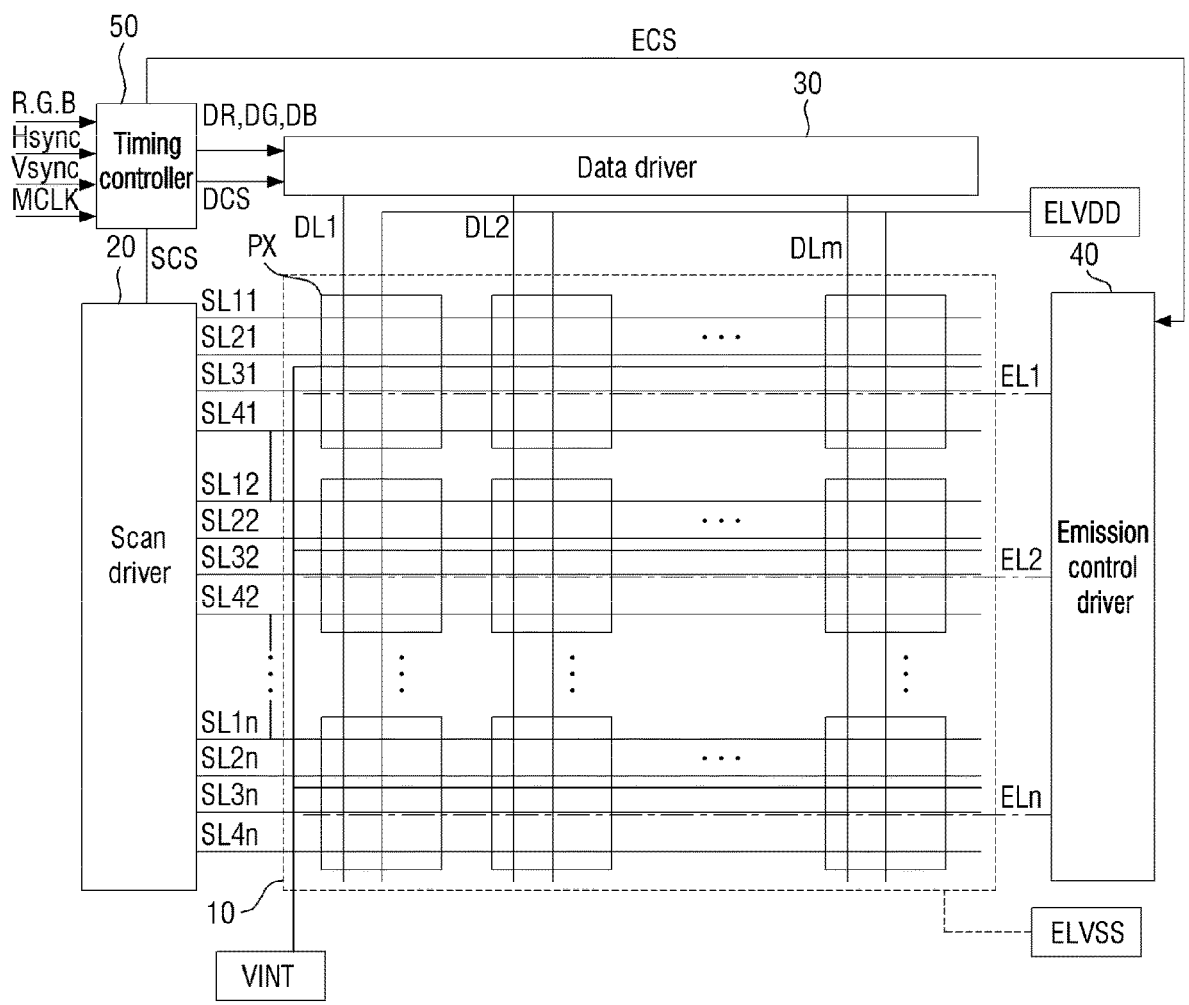
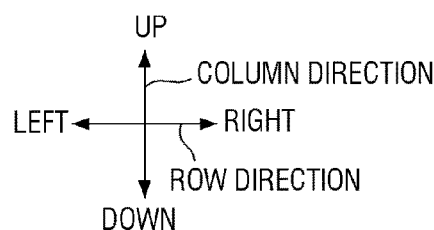

200: 210, 220, 230, 240
400: 410, 420, 430, 440

200_2: 210, 220, 230, 240, 250, 260
400_2: 410, 420

DISPLAY DEVICE

CROSS-REFERENCE TO RELATED APPLICATION

This application claims priority to and the benefit of Korean Patent Application No. 10-2019-0126756, filed on Oct. 14, 2019, the entire disclosure of which is incorporated herein by reference.

BACKGROUND

1. Field

The present disclosure relates to a display device.

2. Description of Related Art

The importance of display devices is increasing with the development of multimedia. Accordingly, various types (e.g., kinds) of display devices such as an organic light-emitting display (OLED) device and a liquid crystal display (LCD) device are being used.

Among the display devices that are generally available, the OLED device includes an organic light-emitting diode that is a self-luminous element. The organic light-emitting diode may include two opposing electrodes and an organic light-emitting layer interposed therebetween. Electrons and holes provided from the two opposing electrodes are recombined in the organic light-emitting layer to generate excitons, and the generated excitons transition from an excited state to a ground state such that light may be emitted.

Because such an OLED device does not require a separate light source, the OLED device may be formed not only to have low power consumption and to be thin and lightweight, but also to have high quality characteristics such as a wide viewing angle, high luminance and contrast, a fast response speed, and the like, thereby receiving attention as a next-generation display device.

P-type metal-oxide-semiconductor (PMOS) transistors are generally used as transistors in an OLED device, but research has been conducted on an OLED device that uses n-type metal-oxide-semiconductor (NMOS) transistors, or PMOS transistors and NMOS transistors together.

SUMMARY

In an organic light-emitting display device using p-type metal-oxide-semiconductor (PMOS) transistors and n-type metal-oxide-semiconductor (NMOS) transistors together, a lower light-shielding pattern may be utilized to shield a lower portion of the NMOS transistor from light. In this case, a gate electrode of the PMOS transistor and the lower light-shielding pattern may be formed in the same layer, and may therefore utilize additional space such that more space may be utilized for one pixel. Thus, it may be difficult to improve resolution.

It should be noted that aspects and features of the present disclosure are not limited to the above-described aspects and features, and other aspects and features of the present disclosure will be apparent to those skilled in the art from the following description.

An embodiment of a display device includes a signal line extending in a first direction, a first transistor configured to control a driving current flowing from a first electrode of the first transistor to a second electrode of the first transistor according to a voltage applied to a gate electrode of the first transistor, a light-emitting element electrically coupled to the second electrode of the first transistor and configured to emit light according to the driving current, a second transistor electrically coupled to the first electrode of the first transistor and configured to transfer a data voltage, a first scan line electrically coupled to a gate electrode of the second transistor and extending in the first direction, a third transistor including a first electrode electrically coupled to the second electrode of the first transistor and a second electrode electrically coupled to the gate electrode of the first transistor, and a second scan line electrically coupled to a gate electrode of the third transistor and extending in the first direction, wherein the second scan line overlaps one selected from among the signal line and the first scan line.

An embodiment of a display device includes a substrate, a first semiconductor layer on the substrate, a first insulating layer that covers the first semiconductor layer and is on the substrate, a first conductive layer on the first insulating layer and including a first scan line extending in a first direction, a second insulating layer that covers the first conductive layer and is on the first insulating layer, a second semiconductor layer on the second insulating layer, a third insulating layer that covers the second semiconductor layer and is on the second insulating layer, and a second conductive layer on the third insulating layer and including a second scan line extending in the first direction, wherein the first scan line overlaps the second scan line.

According to a display device of an exemplary embodiment, a gate electrode of a PMOS transistor can be used as a lower light-shielding pattern of an NMOS transistor without adding a separate lower light-shielding pattern. Accordingly, an additional space for the separate lower light-shielding pattern is not required, and a space utilized for one pixel is reduced, thereby improving resolution of an organic light-emitting display device.

Aspects and features according to the exemplary embodiments are not limited by the content described above, and more various aspects and features are included in the present specification.

BRIEF DESCRIPTION OF THE DRAWINGS

The above and other aspects and features of the present disclosure will become more apparent by describing exemplary embodiments thereof in more detail with reference to the attached drawings, in which:

FIG. 1 is a schematic block diagram illustrating a display device according to an exemplary embodiment;

DETAILED DESCRIPTION

Figure 2:
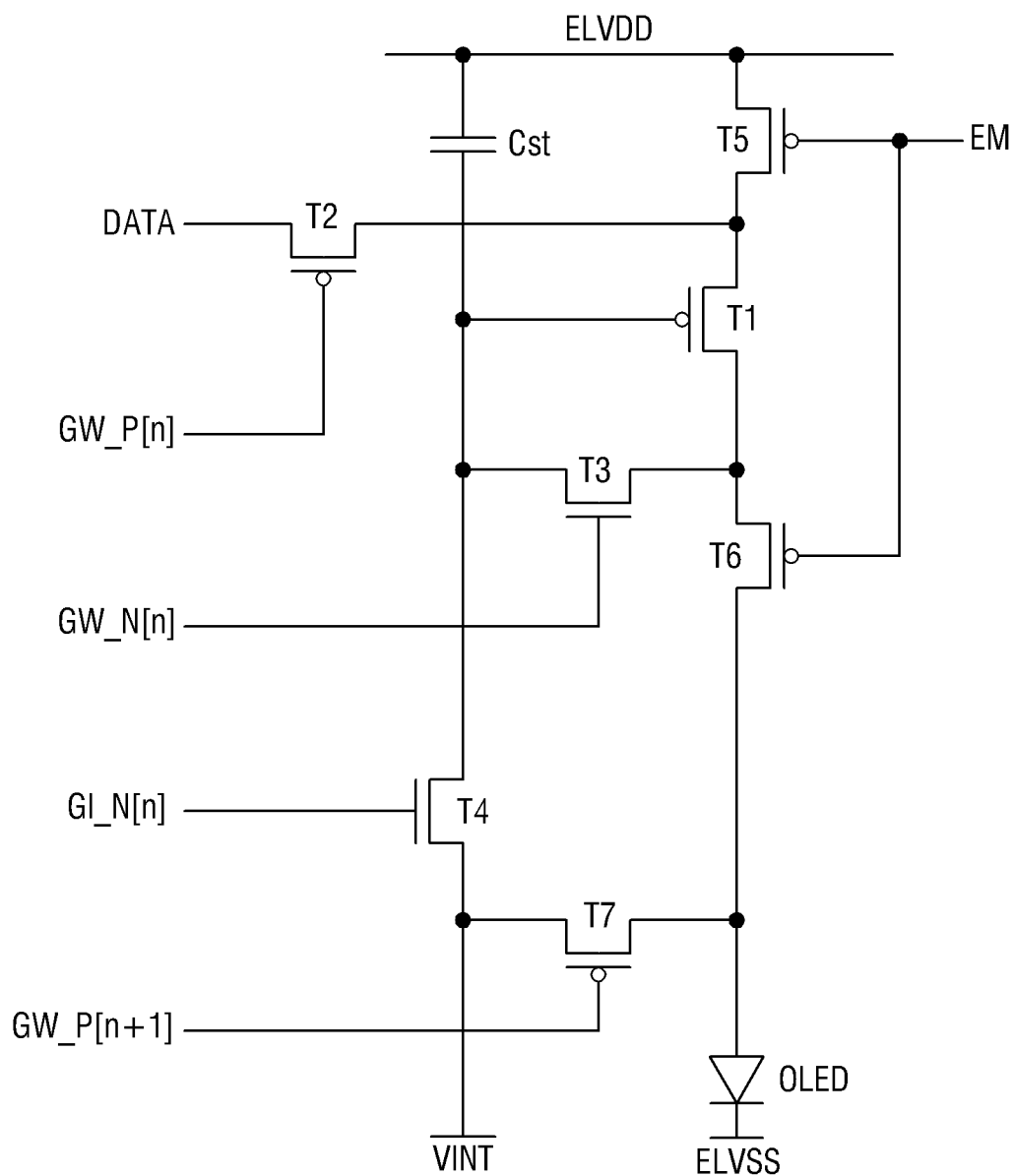
FIG. 2 is an equivalent circuit diagram of one pixel of the display device according to the exemplary embodiment.

The subject matter of the present disclosure will now be described more fully hereinafter with reference to the accompanying drawings, in which some embodiments of the present disclosure are shown. The subject matter of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions may be exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent (e.g., may refer to) "first-category (or first-set)", "second-category (or second-set)", etc., respectively. As used herein, the term "and/or" includes any and all combinations of one or more of the associated listed items.

In concluding the detailed description, those skilled in the art will appreciate that many variations and modifications can be made to the disclosed embodiments without departing from the principles of the present disclosure. Therefore, the disclosed embodiments of the present disclosure are used in a generic and descriptive sense only and not for purposes of limitation.

Hereinafter, exemplary embodiments will be described with reference to the accompanying drawings. An organic light-emitting display device will be described as an example of a display device below.

FIG. 1 is a schematic block diagram illustrating a display device according to an exemplary embodiment.

Referring to FIG. 1, a display device 1 includes a display part 10 including a plurality of pixels PX, a scan driver 20, a data driver 30, a light emission control driver 40, and a controller 50.

The display part 10 includes the plurality of pixels PX arranged in a matrix form (e.g., in a matrix pattern) and positioned at crossings or intersections of a plurality of scan lines SL11 to SL1n, SL21 to SL2n, SL31 to SL3n, and SL41 to SL4n, a plurality of data lines DL1 to DLm, and a plurality of light emission control lines EL1 to ELn. For example, in some embodiments, a pixel PX may correspond to a region where a data line from the plurality of data lines DL1 to DLm crosses each of a first scan line from a plurality of first scan lines SL11 to SL1n, a second scan line from a plurality of second scan lines SL21 to SL2n, a third scan line from a plurality of third scan lines SL31 to SL3n, a fourth scan line from a plurality of fourth scan lines SL41 to SL4n, and a light emission control line from the plurality of light emission control lines EL1 to ELn.

The plurality of scan lines SL11 to SL1n, SL21 to SL2n, SL31 to SL3n, and SL41 to SL4n and the plurality of light emission control lines EL1 to ELn may extend in a row direction, and the plurality of data lines DL1 to DLm may extend in a column direction. The row direction and the column direction may be switched with respect to each other. A supply line of an initialization voltage VINT may be branched for each row and may extend in the row direction. For example, the supply line of the initialization voltage VINT may include a first portion extending in a column direction and a plurality of second portions that branch off from the first portion and extend in the row direction. A supply line of a first power voltage ELVDD may be branched for each column and may extend in the column direction. For example, the first power voltage ELVDD may include a first portion that extends in the row direction and a plurality of second portions that branch off from the first portion and extend in the column direction. However, the present disclosure is not limited thereto, and extending directions of the supply line of the initialization voltage VINT and the supply line of the first power voltage ELVDD may be variously modified.

Three scan lines SL11, SL21, and SL31, one data line DL1, one light emission control line EL1, one supply line of the initialization voltage VINT and one supply line of the first power voltage ELVDD may pass through an exemplary pixel (e.g., a pixel in a first row and first column). Similarly, such lines may pass through at least some of the other pixels.

The scan driver 20 generates three scan signals and transmits the generated three scan signals to each of the pixels through the plurality of scan lines SL11 to SL1n, SL21 to SL2n, SL31 to SL3n, and SL41 to SL4n. For example, the scan driver 20 sequentially supplies scan signals to first scan lines SL11 to SL1n, second scan lines SL21 to SL2n, and third scan lines SL31 to SL3n, and fourth scan lines SL41 to SL4n are coupled to the first scan lines SL11 to SL1n of an adjacent pixel so that the same scan signal as the first scan lines SL11 to SL1n (e.g., the same scan signal transmitted through the first scan lines SL11 to SL1n) of the adjacent pixel is transmitted through the fourth scan line SL41 to SL4n.

The data driver 30 transmits data signals to each of the pixels PX through the plurality of data lines DL1 to DLm. The data signals are supplied to the pixel PX selected by a first scan signal whenever the first scan signal is supplied to the first scan lines SL11 to SL1n.

The light emission control driver 40 generates light emission control signals and transmits the generated light emission control signals to each of the pixels through the plurality of light emission control lines EL1 to ELn. The light emission control signal controls a light emission time of the pixel PX. The light emission control driver 40 may be omitted when the scan driver 20 generates the light emission control signal as well as the scan signal or where an internal structure of the pixel PX accommodates emission of the light emission control driver.

In some embodiments, the display device 1 includes at least one signal line. For example, in some embodiments, the display device 1 includes a plurality of signal lines. In some embodiments, at least one of the signal lines extends in the row direction. In some embodiments, at least one of the signal lines crosses at least one of the pixels and overlaps a portion of a second scan line that crosses the pixel. In some embodiments, at least one of the signal lines is a light emission control line or an initialization voltage line.

The timing controller 50 converts a plurality of image signals R, G, and B transmitted from the outside into a plurality of image data signals DR, DG, and DB and transmits the plurality of image data signals DR, DG, and DB to the data driver 30. In addition, the timing controller 50 receives a vertical synchronizing signal Vsync, a horizontal synchronizing signal Hsync, and a clock signal MCLK; the timing controller 50 generates control signals for controlling driving of the scan driver 20, the data driver 30, and the light emission control driver 40; and the timing controller 50 transmits the generated control signals to the scan driver 20, the data driver 30, and the light emission control driver 40. For example, the timing controller 50 generates and transmits a scan driving control signal SCS for controlling the scan driver 20, a data driving control signal DCS for controlling the data driver 30, and a light emission driving control signal ECS for controlling the light emission control driver 40.

Each of the plurality of pixels PX receives the first power voltage ELVDD and a second power voltage ELVSS. The first power voltage ELVDD may be a set or predetermined high-level voltage, and the second power voltage ELVSS may be a voltage lower than the first power voltage ELVDD.

Each of the plurality of pixels PX emits light, which has a set or predetermined luminance, due to a driving current supplied to a light-emitting element (e.g., a light-emitting element of the pixel PX) according to a data signal transmitted through each of the plurality of data lines DL1 to DLm.

The first power voltage ELVDD, the second power voltage ELVSS, the initialization voltage VINT, and the like may be supplied from an external voltage source.

FIG. 2 is an equivalent circuit diagram of one pixel of the display device according to the exemplary embodiment.

Referring to FIG. 2, a circuit of one pixel of the display device includes an organic light-emitting diode OLED, a plurality of transistors T1 to T7, and a storage capacitor Cst. A data signal DATA, a first scan signal GW_P[n], a second scan signal GW_N[n], a third scan signal GI_N[n], a fourth scan signal GW_P[n+1], a light emission control signal EM, the first power voltage ELVDD, the second power voltage ELVSS, and the initialization voltage VINT are applied to the circuit of one pixel.

The fourth scan signal GW_P[n+1] may be a scan signal that is substantially the same as a first scan signal of an adjacent pixel. For example, there may be four scan lines crossing one pixel, but the scan line through which the fourth scan signal is transmitted from among the four scan lines may be interconnected with (e.g., may be coupled to) the scan line of the adjacent pixel, through which a first scan signal of the adjacent pixel is transmitted, so that the same scan signal may be transmitted through the scan line through which the fourth scan signal is transmitted. For example, as described above, substantially three scan signals may be included in (e.g., may be applied to the circuit of) each pixel.

The organic light-emitting diode OLED includes an anode and a cathode. The storage capacitor Cst includes a first electrode and a second electrode.

The plurality of transistors may include first to seventh transistors T1 to T7. Each of the transistors T1 to T7 includes a gate electrode, a first electrode, and a second electrode. One selected from the first and second electrodes, for each of the transistors T1 to T7, is a source electrode and the other one thereof is a drain electrode.

Each of the transistors T1 to T7 may be a thin film transistor. Each of the transistors T1 to T7 may be one selected from a p-type metal-oxide-semiconductor (PMOS) transistor and an n-type metal-oxide-semiconductor (NMOS) transistor. In one exemplary embodiment, the first transistor T1 serving as a driving transistor, the second transistor T2 serving as a data transfer transistor, the fifth transistor T5 serving as a first light emission control transistor, the sixth transistor T6 serving as a second light emission control transistor, and the seventh transistor T7 serving as a second initialization transistor are PMOS transistors. On the other hand, the third transistor T3 serving as a compensation transistor and the fourth transistor T4 serving as a first initialization transistor are NMOS transistors. A PMOS transistor and an NMOS transistor have different characteristics, and a leakage of a driving current during a light emission period of the organic light-emitting diode OLED may be reduced by forming the third transistor T3 and the fourth transistor T4 with NMOS transistors having relatively excellent turn-off characteristics. For example, in some embodiments, the third transistor T3 and the fourth transistor T4 are NMOS transistors.

Hereinafter, each component will be described in more detail.

The gate electrode of the first transistor T1 is coupled to the first electrode of the storage capacitor Cst. As disclosed herein, when one component is described as being coupled to a second component, the two components may be, for example, electrically coupled. The first electrode of the first transistor T1 is coupled to a terminal of the first power voltage ELVDD via the fifth transistor T5. The second electrode of the first transistor T1 is coupled to the anode of the organic light-emitting diode OLED via the sixth transistor T6. The first transistor T1 receives the data signal DATA according to the switching operation of the second transistor T2 and supplies a driving current to the organic light-emitting diode OLED.

The gate electrode of the second transistor T2 is coupled to a terminal of the first scan signal GW_P[n]. The first electrode of the second transistor T2 is coupled to a terminal of the data signal DATA. The second electrode of the second transistor T2 is coupled to the terminal of the first power voltage ELVDD via the fifth transistor T5 while being coupled to the first electrode of the first transistor T1. The second transistor T2 is turned on in response to the first scan signal GW_P[n] to perform a switching operation of transferring the data signal DATA to the first electrode of the first transistor T1.

The gate electrode of the third transistor T3 is coupled to a terminal of the second scan signal GW_N[n]. The first electrode of the third transistor T3 is coupled to the anode of the organic light-emitting diode OLED via the sixth transistor T6 while being coupled to the second electrode of the first transistor T1. The second electrode of the third transistor T3 is coupled to the first electrode of the storage capacitor Cst, the first electrode of the fourth transistor T4, and the gate electrode of the first transistor T1. The third transistor T3 is turned on in response to the second scan signal GW_N[n] to couple the gate electrode and the second electrode of the first transistor T1 so that the first transistor T1 is diode-coupled. The third transistor T3 forms a diode connection of the first transistor T1 while the scan signal GW_N[n] is active. Accordingly, the voltage difference between the first electrode of the first transistor T1 and the gate electrode of the first transistor T1, which amount corresponds to a threshold voltage of the first transistor T1, is generated due to the diode connection. As a result, a sum of the data signal DATA provided to the first electrode of the first transistor T1 and the voltage difference (i.e., the threshold voltage) is applied to the gate electrode of the first transistor T1 while the scan signal GW_P[n] and GW_N[n] are active. Thus, the data signal DATA is compensated by the threshold voltage of the first transistor T1. The compensated data signal DATA is applied to the gate electrode of the first transistor T1. Accordingly, the uniformity of the driving current can be improved by reducing the effect of the threshold voltage of the first transistor T1.

The gate electrode of the fourth transistor T4 is coupled to a terminal of the third scan signal GI_N[n]. The second electrode of the fourth transistor T4 is coupled to a terminal of the initialization voltage VINT. The first electrode of the fourth transistor T4 is coupled to the first electrode of the storage capacitor Cst, the second electrode of the third transistor T3, and the gate electrode of the first transistor T1. The fourth transistor T4 is turned on in response to the third scan signal GI_N[n] to transfer the initialization voltage VINT to the gate electrode of the first transistor T1, thereby performing an operation of initializing the voltage of the gate electrode of the first transistor T1.

The gate electrode of the fifth transistor T5 is coupled to a terminal of the light emission control signal EM. The first electrode of the fifth transistor T5 is coupled to the terminal of the first power voltage ELVDD. The second electrode of the fifth transistor T5 is coupled to the first electrode of the first transistor T1 and the second electrode of the second transistor T2.

The gate electrode of the sixth transistor T6 is coupled to the terminal of the light emission control signal EM. The first electrode of the sixth transistor T6 is coupled to the second electrode of the first transistor T1 and the first electrode of the third transistor T3. The second electrode of the sixth transistor T6 is coupled to the anode of the organic light-emitting diode OLED.

The fifth transistor T5 and the sixth transistor T6 are turned on concurrently (e.g., simultaneously) in response to the light emission control signal EM and thus the driving current flows through the organic light-emitting diode OLED.

The gate electrode of the seventh transistor T7 is coupled to a terminal of the fourth scan signal GW_P[n+1]. The first electrode of the seventh transistor T7 is coupled to the anode of the organic light-emitting diode OLED. The second electrode of the seventh transistor T7 is coupled to the terminal of the initialization voltage VINT. The seventh transistor T7 is turned on in response to the light emission control signal EM to initialize the anode of the organic light-emitting diode OLED. In some embodiments, the seventh transistor T7 is turned on in response to the fourth scan signal GW_P[n+1] to initialize the anode of the organic light-emitting diode OLED.

In the present exemplary embodiment, a case in which the gate electrode of the seventh transistor T7 receives the fourth scan signal GW_P[n+1] is illustrated. In some embodiments, the circuit of the pixel may be configured such that the gate electrode of the seventh transistor T7 receives the light emission control signal EM.

The second electrode of the storage capacitor Cst is coupled to the terminal of the first power voltage ELVDD. The first electrode of the storage capacitor Cst is coupled to the gate electrode of the first transistor T1, the second electrode of the third transistor T3, and the first electrode of the fourth transistor T4. The cathode of the organic light-emitting diode OLED is coupled to a terminal of the second power voltage ELVSS. The organic light-emitting diode OLED receives the driving current from the first transistor T1 and emits light to display an image.

A plan layout and a cross-sectional structure of the above-described pixel will be described in more detail herein below.

Figure 3:
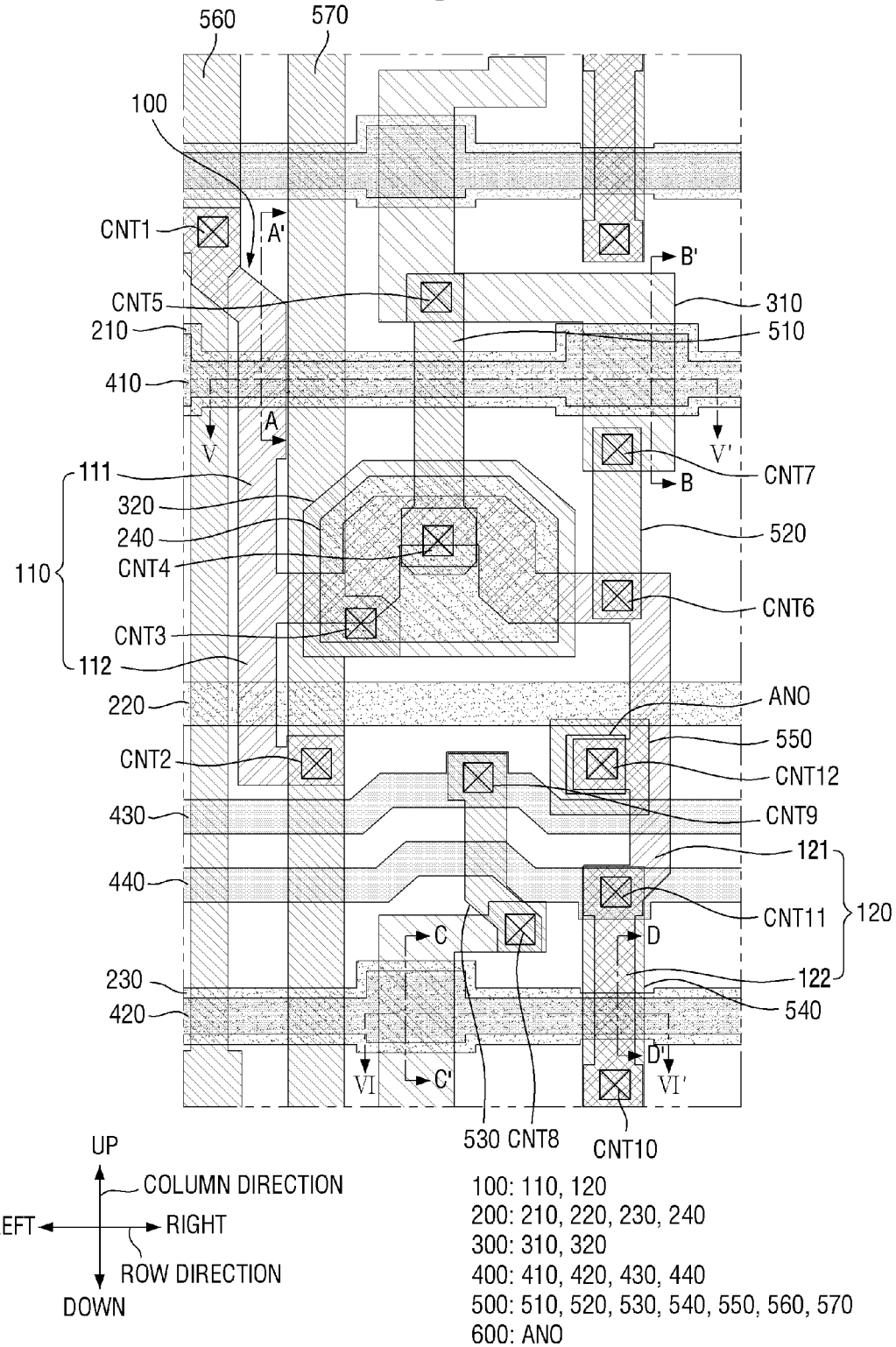
FIG. 3 is a layout diagram of one pixel of the display device according to the exemplary embodiment.
Figure 4:
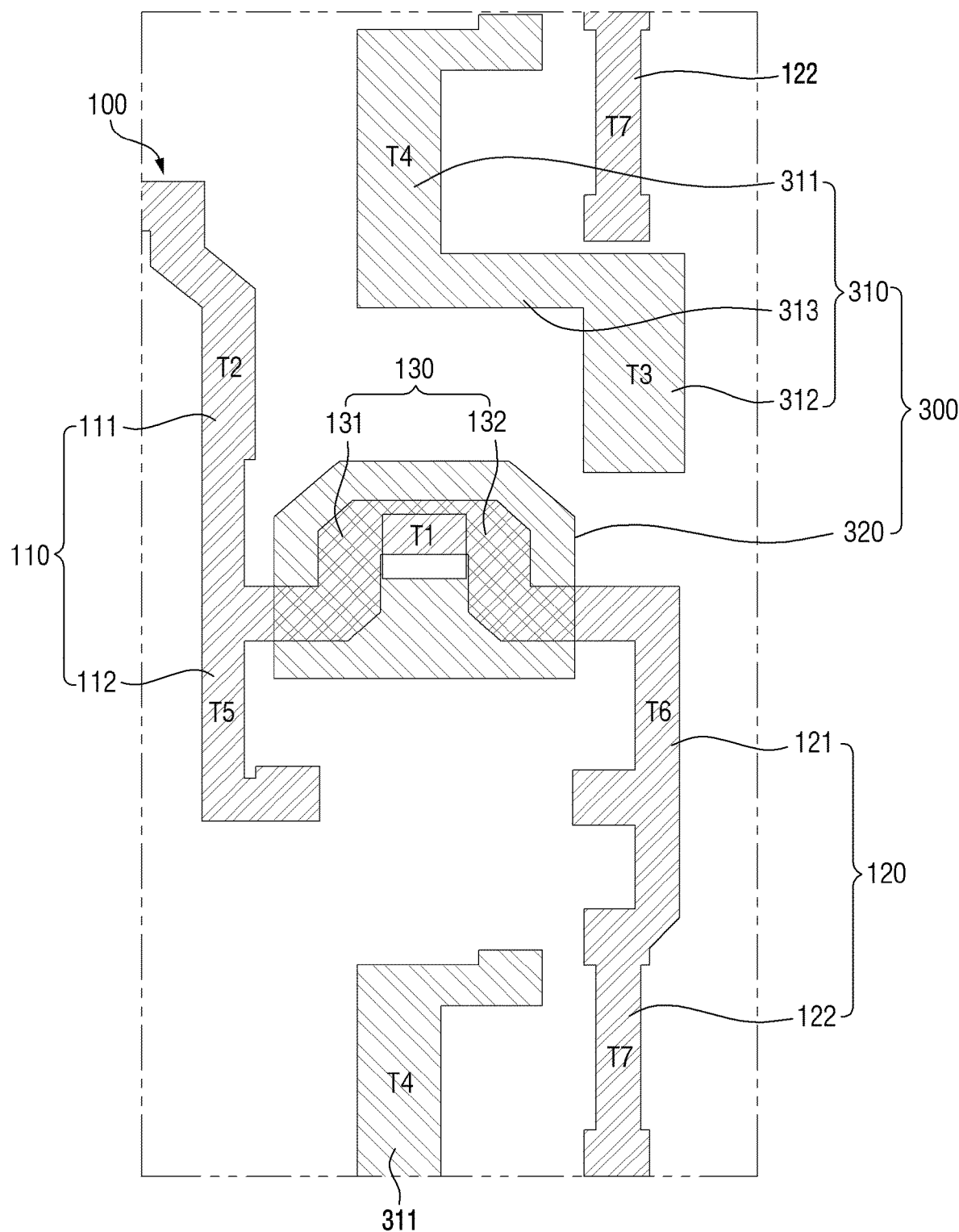
FIG. 4 is a layout diagram of a lower semiconductor layer and an upper semiconductor layer of FIG. 3.
Figure 5:
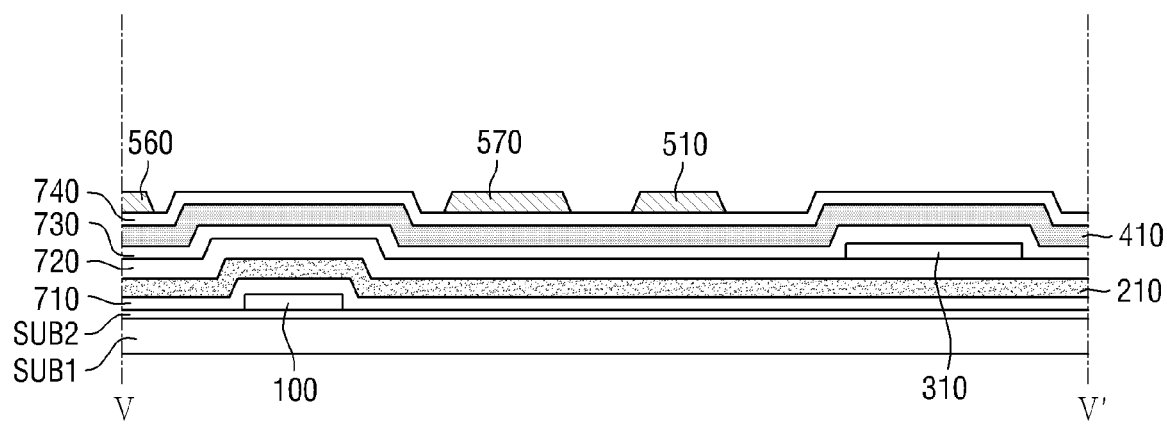
FIG. 5 is a cross-sectional view taken along line V-V' of FIG. 3.
Figure 6:
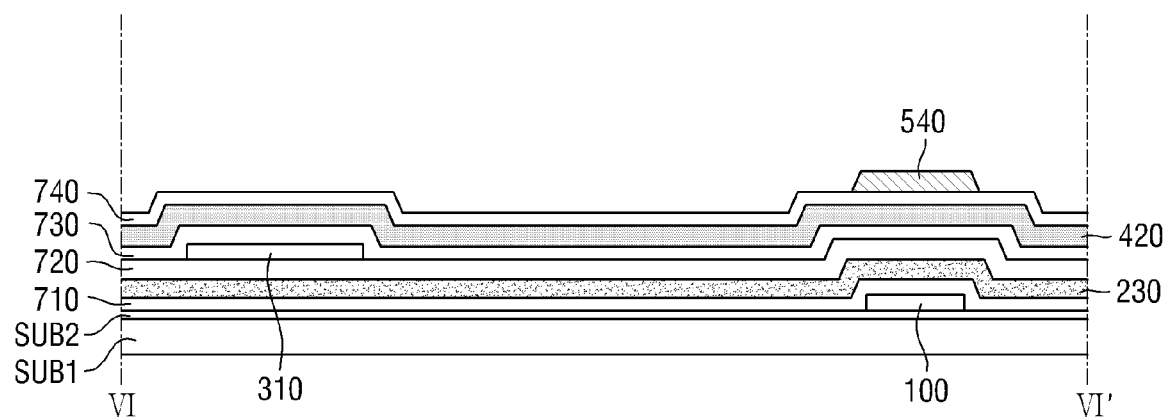
FIG. 6 is a cross-sectional view taken along line VI-VI' of FIG. 3.

FIG. 3 is a layout diagram of one pixel of the display device according to the exemplary embodiment. FIG. 4 is a layout diagram of a lower semiconductor layer and an upper semiconductor layer of FIG. 3. FIG. 5 is a cross-sectional view taken along line V-V of FIG. 3. FIG. 6 is a cross-sectional view taken along line VI-VI' of FIG. 3.

In exemplary embodiments that will be described below, new reference numerals are allocated to components even when the components are the same or substantially the same as those described above with reference to FIGS. 1 and 2 for convenience of explanation of the arrangement of the components and of the coupling relation between the components.

Referring to FIGS. 3 to 6, as described above, the pixel includes a plurality of transistors (hereinafter understood to mean the plurality of transistors T1 to T7 of FIG. 2), a storage capacitor (hereinafter understood to mean the storage capacitor Cst of FIG. 2), and an organic light-emitting diode (hereinafter understood to mean the organic light-emitting diode OLED of FIG. 2).

Each of the transistors T1 to T7 includes a conductive layer forming electrodes, a semiconductor layer forming a channel, and an insulating layer. A top gate type (e.g., arrangement) transistor in which a gate electrode is above the semiconductor layer may be applied to (e.g., may be used for) all of the first transistor T1, the second transistor T2, the fifth transistor T5, the sixth transistor T6, and the seventh transistor T7 that are PMOS transistors, and to the third transistor T3 and the fourth transistor T4 that are NMOS transistors, but the present disclosure is not limited thereto.

The storage capacitor Cst includes conductive layers forming electrodes and an insulating layer between the conductive layers. The organic light-emitting diode OLED includes conductive layers forming an anode and a cathode, and an organic light-emitting layer between the conductive layers. The above-described elements may be electrically coupled to each other by a wire formed of a conductive layer and/or a via formed of a conductive material. The conductive material, the conductive layers, the semiconductor layer, the insulating layer, the organic light-emitting layer, and the like, which are described above, are on a substrate SUB1.

The layers of the pixel may be arranged in the order of the substrate SUB1, a buffer layer SUB2, a lower semiconductor layer 100, a first insulating layer 710, a first conductive layer 200, a second insulating layer 720, an upper semiconductor layer 300, a third insulating layer 730, a second conductive layer 400, a fourth insulating layer 740, and a third conductive layer 500. Each of the above-described layers may be formed as a single-layer film, but in some embodiments each of the above-described layers may be formed as stacked films including a plurality of films. Another layer may be further between the layers.

The substrate SUB1 supports the layers thereon. When the display device is formed in a bottom or double-sided emission type (e.g., arrangement), a transparent substrate may be used. When the display device is formed in a top emission type (e.g., arrangement), a semi-transparent or opaque substrate may be applied as well as the transparent substrate.

The substrate SUB1 may include an insulating material such as glass, quartz, a polymer resin, and/or the like. Examples of the polymer resin may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate SUB1 may also include a metallic material.

The substrate SUB1 may be a flexible substrate that is bendable, foldable, rollable, and/or the like, or the substrate SUB1 may be a rigid substrate. An example of the material forming the flexible substrate may include PI, but the present disclosure is not limited thereto.

The buffer layer SUB2 may be on the entire surface of the substrate SUB1. The buffer layer SUB2 may prevent or reduce the diffusion of impurity ions, prevent or reduce the penetration of moisture and/or external air, and perform a surface planarization function. The buffer layer SUB2 may include silicon nitride, silicon oxide, silicon oxynitride, and/or the like. The buffer layer SUB2 may be omitted according to (e.g., may be omitted depending on) the type (e.g., kind) of the substrate SUB1, process conditions, and/or the like.

The lower semiconductor layer 100 is an active layer forming channels of the first transistor T1, the second transistor T2, the fifth transistor T5, the sixth transistor T6, and the seventh transistor T7.

The lower semiconductor layer 100 may be divided for each pixel unit. The lower semiconductor layer 100 may have a suitable pattern in a plan view. For example, the lower semiconductor layer 100 may include a first longitudinal part 110 and a second longitudinal part 120 that generally extend in the column direction, and a first transverse part 130 that generally extends in the row direction. The first longitudinal part 110, the second longitudinal part 120, and the first transverse part 130 may be physically coupled to each other (e.g., may physically or directly contact each other).

The first longitudinal part 110 may be adjacent to a left side of the pixel, and the second longitudinal part 120 may be adjacent to a right side of the pixel. For example, the first longitudinal part 110 may be closer to the left side of the pixel than to the right side of the pixel, and the second longitudinal part 120 may be closer to the right side of the pixel than to the left side of the pixel. The first longitudinal part 110 and the second longitudinal part 120 may be spaced apart from each other (e.g., spaced apart from each other in the row direction). The first transverse part 130 may couple a middle portion of the first longitudinal part 110 to an upper portion of the second longitudinal part 120. For example, most of the second longitudinal part 120 may be positioned below the first transverse part 130.

In the present specification, a "first region 111" of the first longitudinal part 110 may refer to a region positioned above a connection portion between the first longitudinal part 110 and the first transverse part 130 (e.g., positioned above where the first longitudinal part and the first transverse part 130 are connected) in a plan view, and a "second region 112" of the first longitudinal part 110 may refer to a region positioned below the connection portion between the first longitudinal part 110 and the first transverse part 130 (e.g., positioned below where the first longitudinal part and the first transverse part 130 are coupled) in a plan view.

In addition, a "third region 121" of the second longitudinal part 120 may refer to a region extending downward from a connection between the second longitudinal part 120 and the first transverse part 130 in a plan view by a length equal to or substantially equal to a length in which the first longitudinal part 110 (e.g., the second region 112 of the first longitudinal part 110) extends downward from the connection portion between the first longitudinal part 110 and the first transverse part 130 in a plan view. A "fourth region 122" of the second longitudinal part 120 may refer to a region extending downward from the third region 121. For example, the third region 121 may be directly coupled to (e.g., may directly or physically contact) the first transverse part 130 and may be positioned at an upper side of the second longitudinal part 120, and the fourth region 122 may extend downward from the third region 121, may be coupled to the first transverse part 130 through the third region 121, and may be positioned at a lower side of the second longitudinal part 120.

The channel of the second transistor T2 may be in the first region 111 of the first longitudinal part 110, and the channel of the fifth transistor T5 may be in the second region 112 of the first longitudinal part 110. The channel of the sixth transistor T6 may be in the third region 121 of the second longitudinal part 120, and the channel of the seventh transistor T7 may be in the fourth region 122 of the second longitudinal part 120. The channel of the first transistor T1 may be in the first transverse part 130.

The first transverse part 130 may couple the first longitudinal part 110 to the second longitudinal part 120 at a shortest distance and may include a first bent part 131 that is a left part thereof and a second bent part 132 that is a right part thereof, as illustrated in the drawing. A total length of the first transverse part 130 may increase when the first transverse part 130 is bent a plurality of times.

The lower semiconductor layer 100 may include polycrystalline silicon. The polycrystalline silicon may be formed by crystallizing amorphous silicon. Examples of a method of crystallizing amorphous silicon may include, but are not limited to, a rapid thermal annealing (RTA) method, a solid phase crystallization (SPC) method, an excimer laser annealing (ELA) method, a metal-induced crystallization (MIC) method, a metal-induced lateral crystallization (MILC) method, a sequential lateral solidification (SLS) method, and the like. In some embodiments, the lower semiconductor layer 100 may include single-crystalline silicon, low-temperature polycrystalline silicon, amorphous silicon, and/or the like.

A region (source/drain region) of the lower semiconductor layer 100 coupled to source/drain electrodes (e.g., coupled to the source electrode and/or the drain electrode) of each of the transistors T1, T2, T5, T6, and T7 may be doped with impurity ions (e.g., p-type impurity ions in the case of a PMOS transistor). A trivalent dopant such as boron (B) may be used as the p-type impurity ions.

The first insulating layer 710 may be on the lower semiconductor layer 100, and generally, over the entire surface of the substrate SUB1. For example, the first insulating layer 710 may be on the lower semiconductor layer 100 and on the buffer layer SUB2. The first insulating layer 710 may be a gate insulating film having a gate insulating function.

The first insulating layer 710 may include a silicon compound, a metal oxide, and/or the like. For example, the first insulating layer 710 may include a silicon oxide, a silicon nitride, a silicon oxynitride, an aluminum oxide, a tantalum oxide, a hafnium oxide, a zirconium oxide, a titanium oxide, and/or the like. The above materials may be used alone or in combinations thereof. The first insulating layer 710 may be formed as a single-layer film or a multi-layer film having stacked films of different materials.

The first conductive layer 200 is on the first insulating layer 710. The first conductive layer 200 may include a first scan line 210 through which a first scan signal (hereinafter understood to mean the first scan signal GW_P[n] of FIG. 2) is transmitted, a gate electrode 240 of the first transistor T1, a light emission control line 220 through which a light emission control signal (hereinafter understood to mean the light emission control signal EM of FIG. 2) is transmitted, and a fourth scan line 230 through which a fourth scan signal (hereinafter understood to mean the fourth scan signal GW_P[n+1] of FIG. 2) is transmitted.

The first scan line 210 may include the gate electrode of the second transistor T2, the light emission control line 220 may include the gate electrode of the fifth transistor T5 and the gate electrode of the sixth transistor T6, and the fourth scan line 230 may include the gate electrode of the seventh transistor T7.

Each of the first scan line 210, the light emission control line 220, and the fourth scan line 230 may extend in the row direction. Each of the first scan line 210, the light emission control line 220, and the fourth scan line 230 may extend in the row direction to a neighboring pixel (e.g., an adjacent or nearest pixel) beyond the boundary of the pixel.

The first scan line 210 may be positioned at an upper portion of the pixel in a plan view. The first scan line 210 may overlap the first region 111 of the first longitudinal part 110 of the lower semiconductor layer 100, and the gate electrode of the second transistor T2 may be in an overlapping region between the first scan line 210 and the first region 111. For example, the gate electrode of the second transistor T2 may be in a region where the first scan line 210 overlaps the first region 111. A portion of the first longitudinal part 110 of the lower semiconductor layer 100 (e.g., a portion of the first region 111) which is positioned above the overlapping region may be a first electrode region of the second transistor T2, and a portion of the first longitudinal part 110 of the lower semiconductor layer 100 (e.g., a portion of the first region 111) which is positioned below the overlapping region may be a second electrode region of the second transistor T2. A channel region of the second transistor T2 may be positioned between the first electrode region and the second electrode region thereof, and the channel region of the second transistor T2 may overlap the first scan line 210. The first scan line 210 may not overlap the second longitudinal part 120.

The first scan line 210 extends in the same direction as a second scan line 410 to be described below, and at least a part thereof may overlap the second scan line 410. A more detailed description thereof is provided herein below.

The light emission control line 220 is positioned below the first scan line 210 in a plan view and may overlap the second region 112 of the first longitudinal part 110 of the lower semiconductor layer 100 and the third region 121 of the second longitudinal part 120 of the lower semiconductor layer 100.

The gate electrode of the fifth transistor T5 may be in an overlapping region between the second region 112 of the first longitudinal part 110 of the lower semiconductor layer 100 and the light emission control line 220. For example, the gate electrode of the fifth transistor T5 may be in a region where the light emission control line 220 overlaps the second region 112. A portion of the first longitudinal part 110 of the lower semiconductor layer 100 (e.g., a portion of the second region 112) which is positioned below the overlapping region may be a first electrode region of the fifth transistor T5, and a portion of the first longitudinal part 110 of the lower semiconductor layer 100 (e.g., a portion of the second region 112) which is positioned above the overlapping region may be a second electrode region of the fifth transistor T5. A channel region of the fifth transistor T5 may be positioned between the first electrode region and the second electrode region thereof, and the channel region of the fifth transistor T5 may overlap the light emission control line 220.

In addition, the gate electrode of the sixth transistor T6 may be in an overlapping region between the third region 121 of the second longitudinal part 120 and the light emission control line 220. For example, the gate electrode of the sixth transistor T6 may be in a region where the light emission control line 220 overlaps the third region 121. A portion of the second longitudinal part 120 of the lower semiconductor layer 100 (e.g., a portion of the third region 121) which is positioned above the overlapping region may be a first electrode region of the sixth transistor T6, and a portion of the second longitudinal part 120 of the lower semiconductor layer 100 (e.g., a portion of the third region 121) which is positioned below the overlapping region may be a second electrode region of the sixth transistor T6. A channel region of the sixth transistor T6 may be positioned between the first electrode region and the second electrode region thereof, and the channel region of the sixth transistor T6 may overlap the light emission control line 220.

Widths of the gate electrode of the second transistor T2, the gate electrode of the fifth transistor T5, and the gate electrode of the sixth transistor T6 in their corresponding overlapping regions may be greater than those of lines near these gate electrodes, but the present disclosure is not limited thereto.

The fourth scan line 230 may be positioned at a lower portion of the pixel in a plan view. The gate electrode of the seventh transistor T7 may be in an overlapping region between the fourth region 122 of the second longitudinal part 120 and the fourth scan line 230. For example, the gate electrode of the seventh transistor T7 may be in a region where the fourth scan line 230 overlaps the fourth region 122. A portion of the second longitudinal part 120 of the lower semiconductor layer 100 (e.g., a portion of the fourth region 122) which is positioned above the overlapping region may be a first electrode region of the seventh transistor T7, and a portion of the second longitudinal part 120 of the lower semiconductor layer 100 (e.g., a portion of the fourth region 122) which is positioned below the overlapping region may be a second electrode region of the seventh transistor T7. A channel region of the seventh transistor T7 may be positioned between the first electrode region and the second electrode region thereof, and the channel region of the seventh transistor T7 may overlap the fourth scan line 230.

The fourth scan line 230 extends in the same direction as a third scan line 420 to be described below, and at least a part thereof (e.g., at least a part of the fourth scan line 230) may overlap the third scan line 420. A more detailed description thereof is provided herein below.

The gate electrode 240 of the first transistor T1 may be positioned at a central portion of the pixel in a plan view. The gate electrode 240 of the first transistor T1 may be positioned between the first scan line 210 and the light emission control line 220 in a plan view. The gate electrode 240 of the first transistor T1 may be divided for each pixel unit. In some embodiments, the first conductive layer 200 may be divided for each pixel unit.

The gate electrode 240 of the first transistor T1 overlaps the first transverse part 130 of the lower semiconductor layer 100. A portion of the first transverse part 130 of the lower semiconductor layer 100, which is positioned at a left side of an overlapping region between the gate electrode 240 and the first transverse part 130, may be a first electrode region of the first transistor T1. A portion of the first transverse part 130 of the lower semiconductor layer 100 which is positioned at a right side of the overlapping region may be a second electrode region of the first transistor T1. A channel region of the first transistor T1 may be positioned between the first electrode region and the second electrode region thereof, and the channel region of the first transistor T1 may overlap the gate electrode 240 of the first transistor T1.

The first conductive layer 200 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 200 may be formed as a single-layer film or a multilayer film.

The second insulating layer 720 may be on the first conductive layer 200, and generally, over the entire surface of the substrate SUB1. The second insulating layer 720 serves to insulate the first conductive layer 200 and the upper semiconductor layer 300 from each other. The second insulating layer 720 may be an interlayer insulating film.

The second insulating layer 720 may include an inorganic insulating material, such as a silicon oxide, a silicon nitride, a silicon oxynitride, a hafnium oxide, an aluminum oxide, a titanium oxide, a tantalum oxide and/or a zinc oxide, and/or an organic insulating material, such as a polyacrylate resin, an epoxy resin, a phenolic resin, a polyamide resin, a polyimide resin, an unsaturated polyester resin, a polyphenylene ether resin, a polyphenylene sulfide resin, and/or benzocyclobutene (BCB). The second insulating layer 720 may be formed as a single-layer film or a multilayer film having stacked films of different materials.

The upper semiconductor layer 300 may be on the second insulating layer 720. The upper semiconductor layer 300 may include an upper semiconductor pattern 310, which is an active layer forming channels of the third transistor T3 and the fourth transistor T4, and a storage capacitor electrode 320. The upper semiconductor layer 300 may be divided for each pixel unit.

The upper semiconductor pattern 310 may have a suitable pattern in a plan view. For example, the upper semiconductor pattern 310 may include a third longitudinal part 311 and a fourth longitudinal part 312 that generally extend in the column direction and a second transverse part 313 that generally extends in the row direction. The third longitudinal part 311, the fourth longitudinal part 312, and the second transverse part 313 may be physically coupled to each other (e.g., may physically or directly contact each other).

The third longitudinal part 311 may be adjacent to the left side of the pixel, and the fourth longitudinal part 312 may be adjacent to the right side of the pixel. For example, the third longitudinal part 311 may be closer to the left side of the pixel than to the ride side of the pixel, and the fourth longitudinal part 312 may be closer to the right side of the pixel than to the left side of the pixel. The third longitudinal part 311 and the fourth longitudinal part 312 may be spaced apart from each other. The second transverse part 313 may couple a lower portion of the third longitudinal part 311 to an upper portion of the fourth longitudinal part 312. For example, most of the fourth longitudinal part 312 may be positioned below the third longitudinal part 311.

The second scan line 410 overlaps the fourth longitudinal part 312 of the upper semiconductor pattern 310. A portion of the fourth longitudinal part 312 of the upper semiconductor pattern 310, which is positioned below an overlapping region between the second scan line 410 and the fourth longitudinal part 312, may be a first electrode region of the third transistor T3. A portion of the fourth longitudinal part 312 of the upper semiconductor pattern 310 which is positioned above the overlapping region may be a second electrode region of the third transistor T3. A channel region of the third transistor T3 may be positioned between the first electrode region and the second electrode region thereof, and the channel region of the third transistor T3 may overlap the second scan line 410.

The third scan line 420 overlaps the third longitudinal part 311 of the upper semiconductor pattern 310. A portion of the third longitudinal part 311 of the upper semiconductor pattern 310, which is positioned below an overlapping region between the third scan line 420 and the third longitudinal part 311, may be a first electrode region of the fourth transistor T4, and a portion of the third longitudinal part 311 of the upper semiconductor pattern 310 which is positioned above the overlapping region may be a second electrode region of the fourth transistor T4. A channel region of the fourth transistor T4 may be positioned between the first electrode region and the second electrode region thereof, and the channel region of the fourth transistor T4 may overlap the third scan line 420.

The storage capacitor electrode 320 may be positioned at the central portion of the pixel in the plan view. The storage capacitor electrode 320 overlaps the gate electrode 240 of the first transistor T1 below the storage capacitor electrode 320, and the second insulating layer 720 is between the storage capacitor electrode 320 and the gate electrode 240 to form the storage capacitor Cst. The gate electrode 240 of the first transistor T1 may be the first electrode of the storage capacitor Cst; a portion of the storage capacitor electrode 320, which overlaps the gate electrode 240, may be the second electrode of the storage capacitor Cst; and the second insulating layer 720 interposed between the storage capacitor electrode 320 and the gate electrode 240 may be a dielectric of the storage capacitor Cst. The storage capacitor electrode 320 may include an opening that overlaps the gate electrode 240 of the first transistor T1 below the storage capacitor electrode 320.

The upper semiconductor layer 300 may include an oxide semiconductor. For example, the upper semiconductor layer 300 may include a binary compound (ABx), a ternary compound (ABxCy), or a quaternary compound (ABxCyDz), which contains indium, zinc, gallium, tin, titanium, aluminum, hafnium (Hf), zirconium (Zr), magnesium (Mg), and/or the like. In one exemplary embodiment, the upper semiconductor layer 300 may include ITZO (an oxide containing indium, tin, and zinc) or IGZO (an oxide containing indium, gallium, and zinc).

The third insulating layer 730 may be on the upper semiconductor layer 300, and generally, over the entire surface of the substrate SUB1. For example, in some embodiments, the third insulating layer 730 is on the upper semiconductor layer 300 and on the second insulating layer 720. The third insulating layer 730 may be a gate insulating film having a gate insulating function.

The third insulating layer 730 may include a silicon compound, a metal oxide, and/or the like. For example, the third insulating layer 730 may include a silicon oxide, a silicon nitride, a silicon oxynitride, an aluminum oxide, a tantalum oxide, a hafnium oxide, a zirconium oxide, a titanium oxide, and/or the like. The above materials may be used alone or in combinations thereof. The third insulating layer 730 may be formed as a single-layer film or a multi-layer film having stacked films of different materials.

The second conductive layer 400 is on the third insulating layer 730. The second conductive layer 400 may include the second scan line 410 through which a second scan signal (hereinafter understood to mean the second scan signal GW_N[n] of FIG. 2) is transmitted, the third scan line 420 through which a third scan signal (hereinafter understood to mean the third scan signal GI_N[n] of FIG. 2) is transmitted, and a first initialization voltage line 430 and a second initialization voltage line 440, through which an initialization voltage (hereinafter understood to mean the initialization voltage VINT of FIG. 2) is transmitted.

Each of the second scan line 410, the third scan line 420, the first initialization voltage line 430, and the second initialization voltage line 440 may extend in the row direction. Each of the second scan line 410, the third scan line 420, the first initialization voltage line 430, and the second initialization voltage line 440 may extend in the row direction to a neighboring pixel (e.g., an adjacent or nearest pixel) beyond the boundary of the pixel. The second scan line 410, the third scan line 420, the first initialization voltage line 430, and the second initialization voltage line 440 may overlap the lower semiconductor layer 100.

The third scan line 420 may be positioned at a lower portion of the pixel than the second scan line 410. The second scan line 410 and the third scan line 420 extend in the same direction as the first scan line 210 and the fourth scan line 230, respectively, and may be positioned such that at least parts of the second scan line 410 and the third scan line 420 overlap the first scan line 210 and the fourth scan line 230, respectively. Accordingly, each of the first scan line 210 and the fourth scan line 230 may serve as a gate electrode of a transistor (e.g., of the second transistor T2 and of the seventh transistor T7, respectively) and may also serve as a lower light-shielding pattern of another transistor (e.g., of the third transistor T3 and the fourth transistor T4, respectively) adjacent to the transistor. In order to provide a more detailed description thereof, reference is made to FIGS. 7 to 9.

Figure 7:
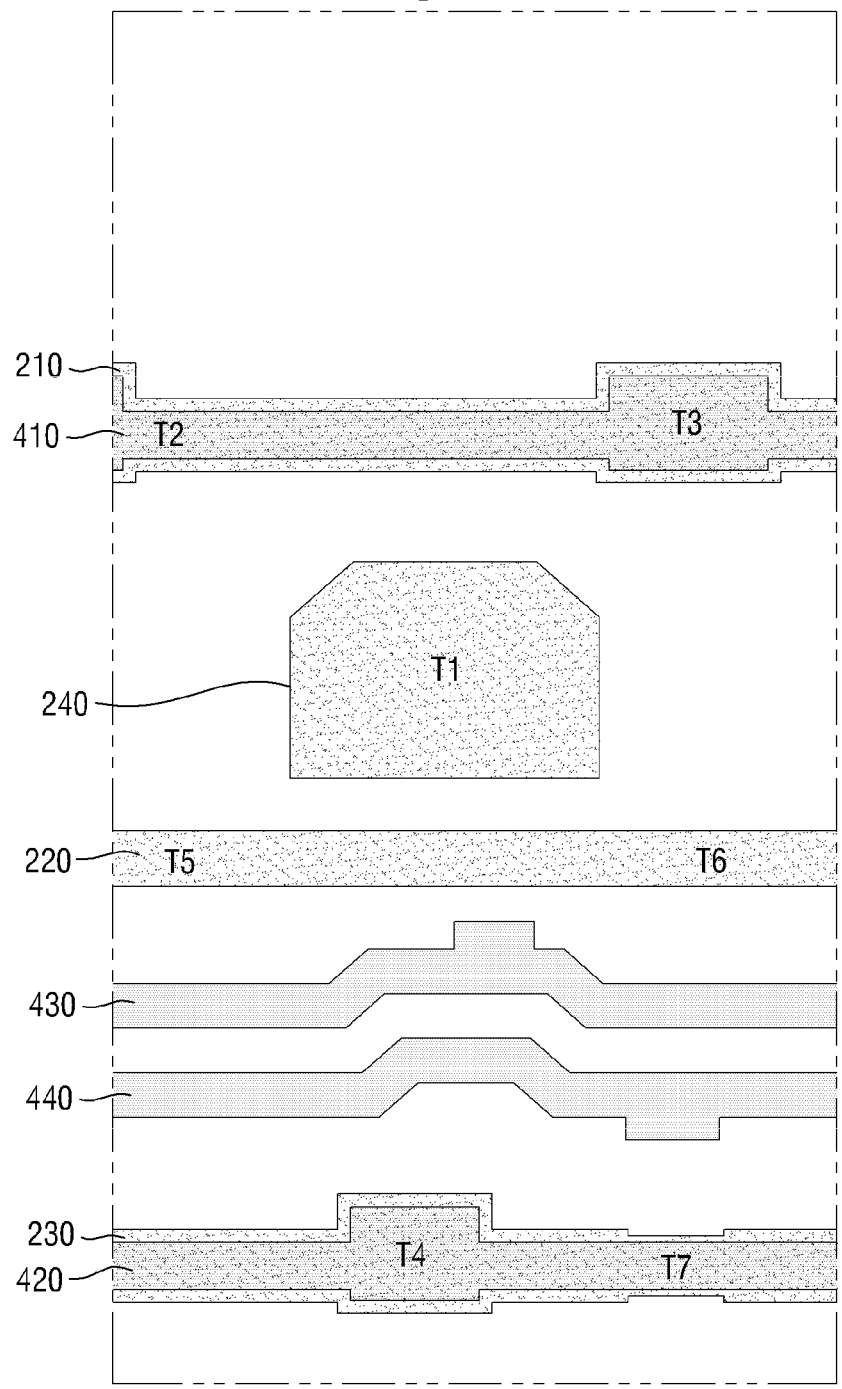
FIG. 7 is a layout diagram of a first conductive layer and a second conductive layer of FIG. 3.
Figure 8:
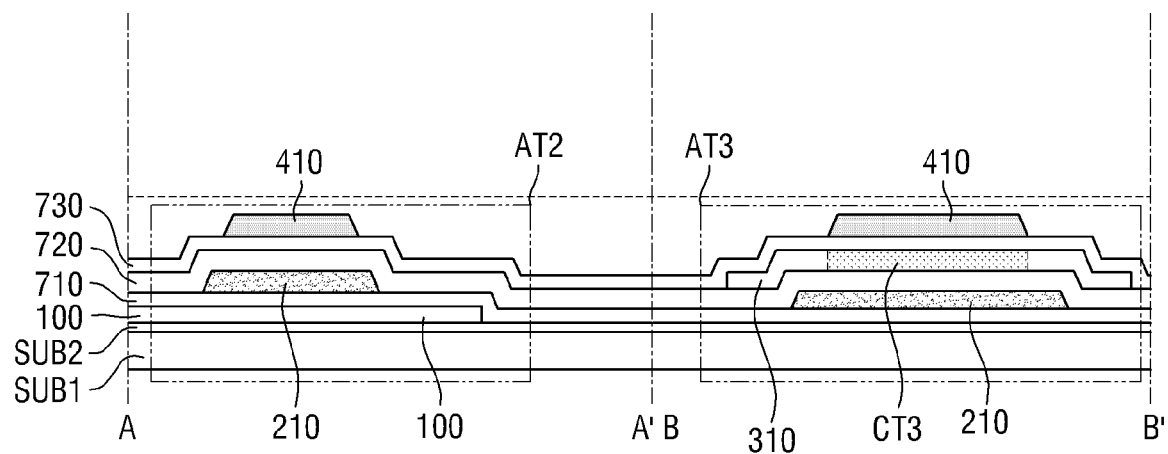
FIG. 8 is a cross-sectional view taken along lines A-A' and B-B' of FIG. 3.
Figure 9:
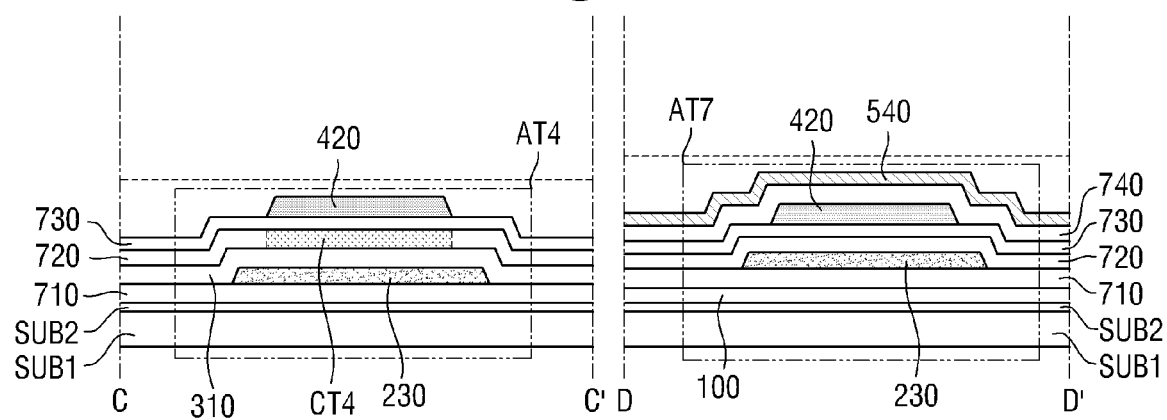
FIG. 9 is a cross-sectional view taken along lines C-C' and D-D' of FIG. 3.

FIG. 7 is a layout diagram of the first conductive layer and the second conductive layer of FIG. 3. FIG. 8 is a cross-sectional view taken along lines A-A' and B-B' of FIG. 3. FIG. 9 is a cross-sectional view taken along lines C-C' and D-D' of FIG. 3.

Referring to FIGS. 3 and 7 to 9, the entire second scan line 410 may overlap the first scan line 210, while only a portion of the first scan line 210 may overlap the second scan line 410. In some embodiments, the entire third scan line 420 may overlap the fourth scan line 230, while only a portion of the fourth scan line 230 may overlap the third scan line 420. For example, a width of the second scan line 410 in the column direction may be less than or equal to a width of the first scan line 210 in the column direction, and the first scan line 210 may completely overlap the second scan line 410, while only a portion of the first scan line 210 may overlap the second scan line 410. For example, a portion of the first scan line 210 may overlap the entire second scan line 410. In some embodiments, a width of the third scan line 420 in the column direction may be less than or equal to a width of the fourth scan line 230 in the column direction, and the fourth scan line 230 may completely overlap the third scan line 420, while only a portion of the fourth scan line 230 may overlap the third scan line 420. For example, a portion of the fourth scan line 230 may overlap the entire third scan line 420.

The shape of the second scan line 410 may be the same or substantially the same as the shape of the first scan line 210, and the shape of the third scan line 420 may be the same or substantially the same as the shape of the fourth scan line 230. Here, the term "the same or substantially the same shape" does not necessarily mean that the sizes (e.g., dimensions) are the same, but it means that they may be formed in the same or substantially the same pattern. For example, although each of the second scan line 410 and the third scan line 420 may have the same general pattern as the first scan line 210 and the fourth scan line 230, respectively, each of the second scan line 410 and the third scan line 420 may have the same or different dimensions (e.g., widths) compared to the first scan line 210 and the fourth scan line 230, respectively.

In addition, in one pixel PX, the area of the first scan line 210 in a plan view may be greater than the area of the second scan line 410 in a plan view, and the area of the fourth scan line 230 in a plan view may be greater than the area of the third scan line 420 in a plan view.

However, the present disclosure is not limited thereto. For example, in some embodiments, only in a region in which the first scan line 210 and the second scan line 410 overlap the upper semiconductor pattern 310, the width of the first scan line 210 in the column direction may be greater than or equal to the width of the second scan line 410 in the column direction, and the first scan line 210 may completely overlap the second scan line 410 at the region in which the first scan line 210 and the second scan line 410 overlap the upper semiconductor pattern 310. Outside the region in which the first scan line 210 and the second scan line 410 overlap the upper semiconductor pattern 310, the width of the first scan line 210 in the column direction may be less than the width of the second scan line 410 in the column direction. In some embodiments, the first scan line 210 and the second scan line 410 may partially overlap or may not overlap each other outside the region in which the first scan line 210 and the second scan line 410 overlap the upper semiconductor pattern 310. In some embodiments, only in a region in which the fourth scan line 230 and the third scan line 420 overlap the upper semiconductor pattern 310, the width of the fourth scan line 230 in the column direction may be greater than or equal to the width of the third scan line 420 in the column direction, and the fourth scan line 230 may completely overlap the third scan line 420 at the region in which the fourth scan line 230 and the third scan line 420 overlap the upper semiconductor pattern 310. Outside the region in which the fourth scan line 230 and the third scan line 420 overlap the upper semiconductor pattern 310, the width of the fourth scan line 230 in the column direction may be less than the width of the third scan line 420 in the column direction. In some embodiments, the fourth scan line 230 and the third scan line 420 may partially overlap or may not overlap each other outside the region in which the fourth scan line 230 and the third scan line 420 overlap the upper semiconductor pattern 310.

A width of a channel region CT3 of the third transistor T3 in the column direction may not be greater than the width of the second scan line 410 in the column direction, and the first scan line 210 may completely overlap the channel region CT3 of the third transistor T3. For example, the width of the first scan line 210 in the column direction may be greater than or equal to the width of the channel region CT3 of the third transistor T3 in the column direction, and the first scan line 210 may surround the channel region CT3 of the third transistor T3 in a plan view.

In some embodiments, a width of a channel region CT4 of the fourth transistor T4 in the column direction may not be greater than the width of the third scan line 420 in the column direction, and the fourth scan line 230 may completely overlap the channel region CT4 of the fourth transistor T4. For example, the width of the fourth scan line 230 in the column direction may be greater than or equal to the width of the channel region CT4 of the fourth transistor T4 in the column direction, and the fourth scan line 230 may surround the channel region CT4 of the fourth transistor T4 in a plan view.

The second transistor T2 is formed on the lower semiconductor layer 100 in a region in which the lower semiconductor layer 100 and the first scan line 210 overlap each other, the third transistor T3 is formed in a region in which the upper semiconductor pattern 310 and the second scan line 410 overlap each other, the second scan line 410 overlaps the first scan line 210 so that the second transistor T2 may overlap the second scan line 410, and the third transistor T3 may overlap the first scan line 210. For example, the second transistor T2 and the third transistor T3 may be formed along one scan line (e.g., the first scan line 210 or the second scan line 410). For example, the second transistor T2 and the third transistor T3 may be alternately formed in a direction in which the first scan line 210 extends and a direction in which the second scan line 410 extends.

Further, the seventh transistor T7 is formed on the lower semiconductor layer 100 in a region in which the lower semiconductor layer 100 and the fourth scan line 230 overlap each other, the fourth transistor T4 is formed in a region in which the upper semiconductor pattern 310 and the third scan line 420 overlap each other, the third scan line 420 overlaps the fourth scan line 230 so that the seventh transistor T7 may overlap the third scan line 420, and the fourth transistor T4 may overlap the fourth scan line 230. For example, the fourth transistor T4 and the seventh transistor T7 may be formed along one scan line (e.g., the fourth scan line 230 or the third scan line 420). For example, the fourth transistor T4 and the seventh transistor T7 may be alternately formed in a direction in which the fourth scan line 230 extends and a direction in which the third scan line 420 extends.

Each of the first scan line 210 and the fourth scan line 230 may perform a function of a gate electrode in one transistor and may also perform a function of a lower light-shielding pattern in another transistor adjacent to the one transistor. The lower light-shielding pattern refers to a component that serves to prevent or reduce the occurrence of light incident from a lower direction of the display device 1 from entering the upper semiconductor pattern 310 positioned above the lower light-shielding pattern. The lower light-shielding pattern may overlap the channel regions of the transistors (e.g., the third transistor T3 and the fourth transistor T4), which form the channels in the upper semiconductor pattern 310.

For example, the first scan line 210 may be between the lower semiconductor layer 100 and the second scan line 410 in the region in which the second transistor T2 is located (hereinafter, referred to as a second transistor region AT2) to perform a function of the gate electrode of the second transistor T2. In addition, the first scan line 210 may be below the upper semiconductor pattern 310 and the second scan line 410 in the region in which the third transistor T3 positioned at a right side of the second transistor T2 is located (hereinafter, referred to as a third transistor region AT3) to perform a function of a lower light-shielding pattern of the third transistor T3.

In some embodiments, the fourth scan line 230 may be below the upper semiconductor pattern 310 and the third scan line 420 in the region in which the fourth transistor T4 is located (hereinafter, referred to as a fourth transistor region AT4) to perform a function of a lower light-shielding pattern of the fourth transistor T4. In addition, the fourth scan line 230 may be between the lower semiconductor layer 100 and the third scan line 420 in the region in which the seventh transistor T7 positioned at a right side of the fourth transistor T4 is located (hereinafter, referred to as a seventh transistor region AT7) to perform a function of the gate electrode of the seventh transistor T7.

As described above, because one scan line (e.g., the first scan line 210 or the fourth scan line 230) is used as the gate electrode and the lower light-shielding pattern in different regions (e.g., the gate electrode in the second transistor region AT2 and the lower light-shielding pattern in the third transistor region AT3 for the first scan line 210, or the gate electrode in the seventh transistor region AT7 and the lower light-shielding pattern in the fourth transistor region AT4 for the fourth scan line 230)), a separate lower light-shielding pattern may be unnecessary. For example, a separate space for designing the above-described separate lower light-shielding pattern may not be necessary in one pixel so that a space utilized for one pixel is reduced. Accordingly, more pixels may be in the display device 1, and thus resolution may be improved.

Referring to FIGS. 3 to 6 again, the first initialization voltage line 430 and the second initialization voltage line 440 may be positioned between the fourth scan line 230 and the light emission control line 220 in a plan view. The first initialization voltage line 430 may be positioned above the second initialization voltage line 440. In some embodiments, the second initialization voltage line 440 may be electrically coupled to the first initialization voltage line 430 through contact holes outside the display part or may receive the initialization voltage VINT, which is equal to the voltage at the first initialization voltage line 430, directly from an external voltage source. In another exemplary embodiment, either one of the first initialization voltage line 430 and the second initialization voltage line 440 may be omitted.

The second scan line 410 may include the gate electrode of the third transistor T3, the third scan line 420 may include the gate electrode of the fourth transistor T4, and the light emission control line 220 may include the gate electrode of the sixth transistor T6. The widths of the gate electrode of the third transistor T3, the gate electrode of the fourth transistor T4, and the gate electrode of the sixth transistor T6 may be greater than those of lines near the gate electrode of the third transistor T3, the gate electrode of the fourth transistor T4, and the gate electrode of the sixth transistor T6, but the present disclosure is not limited thereto.

The second conductive layer 400 may include at least one selected from among Mo, Al, Pt, Pd, Ag, Mg, Au, Ni, Nd, Ir, Cr, Ca, Ti, Ta, W, and Cu.

The fourth insulating layer 740 covers the second conductive layer 400. The fourth insulating layer 740 may be generally over the entire surface of the substrate SUB1. For example, in some embodiments, the fourth insulating layer 740 may be on the second conductive layer 400. The fourth insulating layer 740 serves to insulate the second conductive layer 400 and the third conductive layer 500 from each other. The fourth insulating layer 740 may be an interlayer insulating film. The fourth insulating layer 740 may include the same material as the second insulating layer 720 described above or may include at least one material selected from the exemplified materials constituting the second insulating layer 720. In some embodiments, the fourth insulating layer 740 may include at least one material selected from among the materials that may be included in the second insulating layer 720. The fourth insulating layer 740 may be formed as a single-layer film or a multilayer film including stacked films of different materials.

The third conductive layer 500 may be on the fourth insulating layer 740. The third conductive layer 500 may include a data line 560 through which a data signal (hereinafter understood to mean the data signal DATA of FIG. 2) is transmitted, and a first power voltage line 570 through which a first power voltage (hereinafter understood to mean the first power voltage ELVDD of FIG. 2) is supplied, and a plurality of data patterns 510, 520, 530, 540, and 550.

The data line 560 may extend in the column direction. The data line 560 may extend in the column direction to a neighboring pixel (e.g., an adjacent or nearest pixel) beyond the boundary of the pixel. The data line 560 may be adjacent to the left side of the pixel. The data line 560 may overlap the first longitudinal part 110 of the lower semiconductor layer 100.

The data line 560 may be in contact (e.g., electrical contact) with the first region 111 of the first longitudinal part 110 of the lower semiconductor layer 100 through a first contact hole CNT1 exposing the first region 111 of the first longitudinal part 110 of the lower semiconductor layer 100 while passing through the fourth insulating layer 740, the third insulating layer 730, the second insulating layer 720, and the first insulating layer 710. The first contact hole CNT1 may be positioned above the first scan line 210 in a plan view, but the present disclosure is not limited thereto.

The first power voltage line 570 may extend in the column direction. The first power voltage line 570 may extend in the column direction to a neighboring pixel (e.g., an adjacent or nearest pixel) beyond the boundary of the pixel. The first power voltage line 570 may be at a right side of the data line 560 to be generally adjacent to the left side of the pixel, but the present disclosure is not limited thereto. For example, the first power voltage line 570 may be at the right side of the data line 560 and may be closer to the left side of the pixel than to the right side of the pixel.

The first power voltage line 570 may be in contact (e.g., electrical contact) with the second region 112 of the first longitudinal part 110 of the lower semiconductor layer 100 through a second contact hole CNT2 exposing the second region 112 of the first longitudinal part 110 of the lower semiconductor layer 100 while passing through the fourth insulating layer 740, the third insulating layer 730, the second insulating layer 720, and the first insulating layer 710. The second contact hole CNT2 may be positioned below the light emission control line 220 in a plan view, but the present disclosure is not limited thereto.

The first power voltage line 570 may be in contact (e.g., electrical contact) with the storage capacitor electrode 320 through a third contact hole CNT3 exposing the storage capacitor electrode 320 while passing through the fourth insulating layer 740 and the third insulating layer 730.

The plurality of data patterns may include a first data pattern 510, a second data pattern 520, a third data pattern 530, a fourth data pattern 540, and a fifth data pattern 550. Each of the data patterns 510, 520, 530, 540, and 550 has a shape roughly extending in the column direction, and the lengths of the data patterns 510, 520, 530, 540, and 550 in the column direction are less than the length of the pixel in the column direction. The data patterns 510, 520, 530, 540, and 550 are physically spaced apart from each other. The portions of the data patterns 510, 520, 530, 540, and 550, which are spaced apart from each other, are electrically coupled to each other.

The first data pattern 510 may overlap the gate electrode 240 of the first transistor T1. In an overlapping region between the first data pattern 510 and the gate electrode 240, the first data pattern 510 may be electrically coupled to the gate electrode 240 of the first transistor T1 through a fourth contact hole CNT4 exposing the gate electrode 240 of the first transistor T1 while passing through the fourth insulating layer 740, the third insulating layer 730, and the second insulating layer 720. The fourth contact hole CNT4 may be positioned in the opening of the storage capacitor electrode 320. The first data pattern 510 in the fourth contact hole CNT4 and the storage capacitor electrode 320 adjacent thereto may be insulated from each other by the third insulating layer 730 and the fourth insulating layer 740.

Further, the first data pattern 510 may extend upward from an overlapping region between the first data pattern 510 and the gate electrode 240 of the first transistor T1 and cross or intersect the first scan line 210 and the second scan line 410 while being insulated from the first scan line 210 and the second scan line 410. The first data pattern 510 may further extend upward to overlap the upper semiconductor pattern 310. In the overlapping region (e.g., the region where the first data pattern 510 and the upper semiconductor pattern 310 overlap), the first data pattern 510 may be electrically coupled to the upper semiconductor pattern 310 through a fifth contact hole CNT5 exposing the upper semiconductor pattern 310 while passing through the fourth insulating layer 740 and third insulating layer 730.

The second data pattern 520 may overlap the first transverse part 130 and/or the third region 121 of the second longitudinal part 120 of the lower semiconductor layer 100. In an overlapping region between the second data pattern 520 and the first transverse part 130 and/or the third region 121, the second data pattern 520 may be in contact (e.g., electrical contact) with the first transverse part 130 and/or the third region 121 of the second longitudinal part 120 of the lower semiconductor layer 100 through a sixth contact hole CNT6 exposing the first transverse part 130 and/or the third region 121 of the second longitudinal part 120 of the lower semiconductor layer 100 while passing through the fourth insulating layer 740, the third insulating layer 730, the second insulating layer 720, and the first insulating layer 710.

Further, the second data pattern 520 may extend upward from the overlapping region between the second data pattern 520 and the first transverse part 130 and/or the third region 121 of the second longitudinal part 120 of the lower semiconductor layer 100 to overlap the fourth longitudinal part 312 of the upper semiconductor pattern 310. In the overlapping region between the second data pattern 520 and the fourth longitudinal part 312, the second data pattern 520 may be in contact (e.g., electrical contact) with the fourth longitudinal part 312 of the upper semiconductor pattern 310 through a seventh contact hole CNT7 exposing the fourth longitudinal part 312 of the upper semiconductor pattern 310 while passing through the fourth insulating layer 740 and the third insulating layer 730. Accordingly, the lower semiconductor layer 100 and the fourth longitudinal part 312 of the upper semiconductor pattern 310 may be electrically coupled to each other through the second data pattern 520.

The third data pattern 530 may overlap the third longitudinal part 311 of the upper semiconductor pattern 310. In an overlapping region between the third data pattern 530 and the third longitudinal part 311, the third data pattern 530 may be in contact (e.g., electrical contact) with the third longitudinal part 311 of the upper semiconductor pattern 310 through an eighth contact hole CNT8 exposing the third longitudinal part 311 of the upper semiconductor pattern 310 while passing through the fourth insulating layer 740 and the third insulating layer 730.

Further, the third data pattern 530 may extend upward from the overlapping region between the third data pattern 530 and the third longitudinal part 311 of the upper semiconductor pattern 310 in a plan view and cross intersect the second initialization voltage line 440 while being insulated from the second initialization voltage line 440. The third data pattern 530 may further extend upward from a crossing or intersection region between the third data pattern 530 and the second initialization voltage line 440 to overlap the first initialization voltage line 430. In an overlapping region between the third data pattern 530 and the first initialization voltage line 430, the third data pattern 530 may be in contact (e.g., electrical contact) with the first initialization voltage line 430 through a ninth contact hole CNT9 exposing the first initialization voltage line 430 while passing through the fourth insulating layer 740. Accordingly, the third longitudinal part 311 of the upper semiconductor pattern 310 may be electrically coupled to the first initialization voltage line 430 through the ninth contact hole CNT9. For example, the third longitudinal part 311 of the upper semiconductor pattern 310 may be electrically coupled to the first initialization voltage line 430 through the third data pattern 530.

The fourth data pattern 540 may overlap the fourth region 122 of the second longitudinal part 120 of the lower semiconductor layer 100. In an overlapping region between the fourth data pattern 540 and the fourth region 122, the fourth data pattern 540 may be in contact (e.g., electrical contact) with the fourth region 122 of the second longitudinal part 120 of the lower semiconductor layer 100 through a tenth contact hole CNT10 exposing the fourth region 122 of the second longitudinal part 120 of the lower semiconductor layer 100 while passing through the fourth insulating layer 740, the third insulating layer 730, the second insulating layer 720, and the first insulating layer 710. The tenth contact hole CNT10 may be positioned below the third scan line 420 and the fourth scan line 230, but the present disclosure is not limited thereto.

Further, the fourth data pattern 540 may further extend upward from the overlapping region between the fourth data pattern 540 and the fourth region 122 of the second longitudinal part 120 of the lower semiconductor layer 100 to cross or intersect the third scan line 420 and the fourth scan line 230 while being insulated from the third scan line 420 and the fourth scan line 230. The fourth data pattern 540 may further extend upward from a crossing or intersection region between the fourth data pattern 540, and the third scan line 420 and the fourth scan line 230 to overlap the second initialization voltage line 440. In an overlapping region between the fourth data pattern 540 and the second initialization voltage line 440, the fourth data pattern 540 may be in contact (e.g., electrical contact) with the second initialization voltage line 440 through an eleventh contact hole CNT11 exposing the second initialization voltage line 440 while passing through the fourth insulating layer 740. Accordingly, the fourth region 122 of the second longitudinal part 120 of the lower semiconductor layer 100 may be electrically coupled to the second initialization voltage line 440 through the eleventh contact hole CNT11. For example, the fourth region 122 of the second longitudinal part 120 of the lower semiconductor layer 100 may be electrically coupled to the second initialization voltage line 440 through the fourth data pattern 540.

The fifth data pattern 550 may overlap the third region 121 of the second longitudinal part 120 of the lower semiconductor layer 100. In an overlapping region between the fifth data pattern 550 and the third region 121, the fifth data pattern 550 may be in contact (e.g., electrical contact) with the third region 121 of the second longitudinal part 120 of the lower semiconductor layer 100 through a twelfth contact hole CNT12 exposing the third region 121 of the second longitudinal part 120 of the lower semiconductor layer 100 while passing through the fourth insulating layer 740, the third insulating layer 730, the second insulating layer 720, and the first insulating layer 710. The fifth data pattern 550 may be coupled (e.g., electrically coupled) to the anode ANO of the organic light-emitting diode. A more detailed description thereof is provided herein below.

The third conductive layer 500 may include at least one selected from among Mo, Al, Pt, Pd, Ag, Mg, Au, Ni, Nd, Ir, Cr, Ca, Ti, Ta, W, and Cu. The third conductive layer 500 may be formed as a single-layer film or a multilayer film. For example, the third conductive layer 500 may be formed in a stacked structure of Ti/Al/Ti, Mo/Al/Mo, Mo/AlGe/Mo, Ti/Cu, and/or the like.

In some embodiments, a fifth insulating layer, a fourth conductive layer 600, the organic light-emitting layer, and a fifth conductive layer may be sequentially on the third conductive layer 500. An anode ANO of the organic light-emitting diode may be formed of the fourth conductive layer 600, and the cathode thereof may be formed of the fifth conductive layer. The anode ANO may be electrically coupled to the fifth data pattern 550 through a contact hole(s) passing through the fifth insulating layer.

Hereinafter, other exemplary embodiments will be described. In the following exemplary embodiments, duplicated descriptions of the same components as those of the above-described exemplary embodiments will be simplified or will not be repeated, and the differences will be mainly described.

Figure 10:
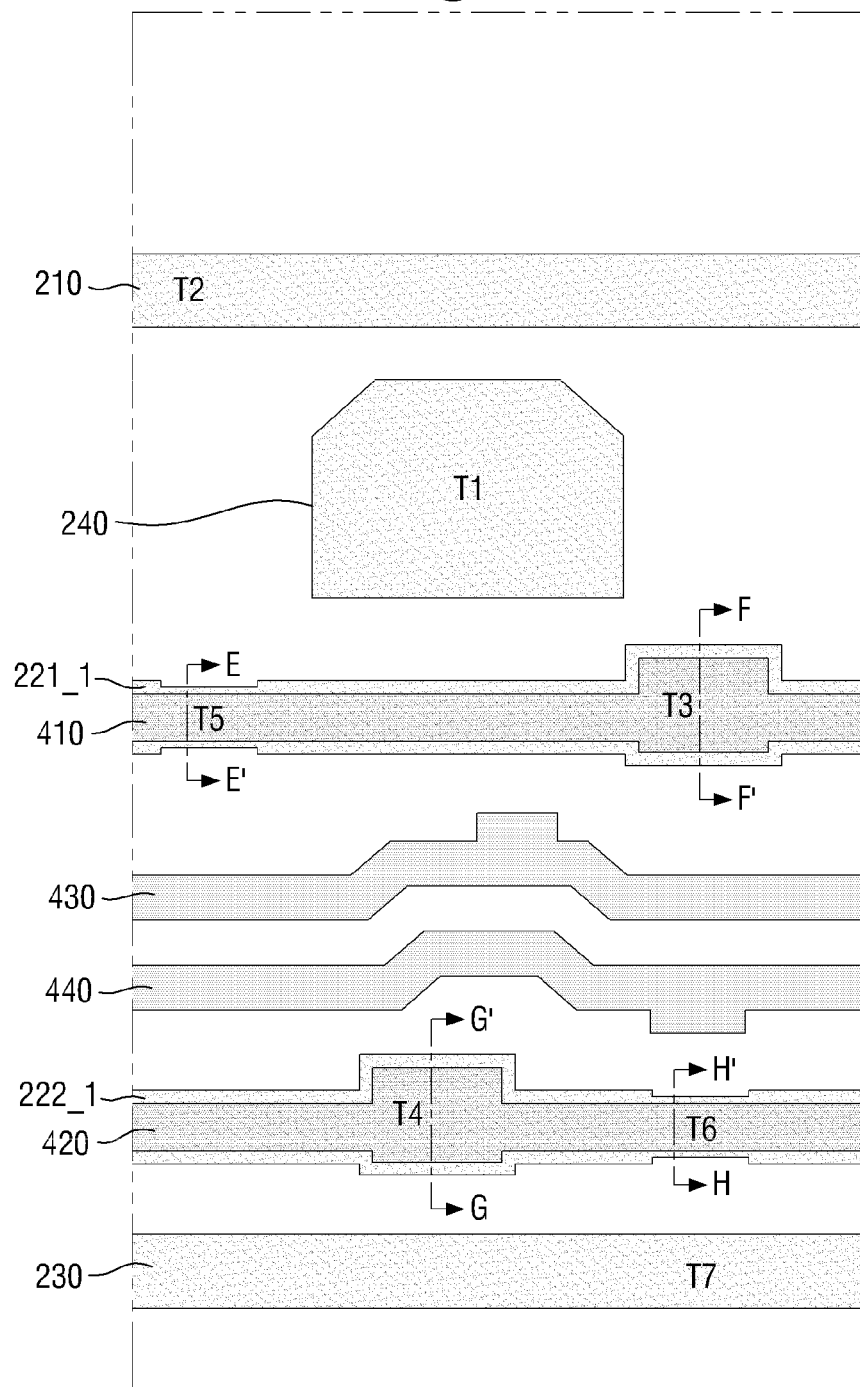
FIG. 10 is a layout diagram of a first conductive layer and a second conductive layer according to an exemplary embodiment.
Figure 11:
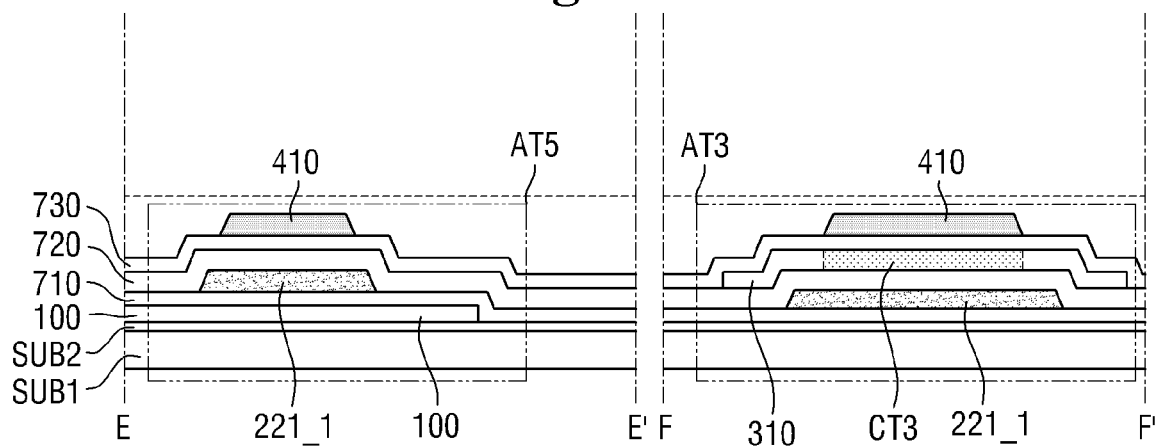
FIG. 11 is a cross-sectional view taken along lines E-E' and F-F' of FIG. 10.
Figure 12:
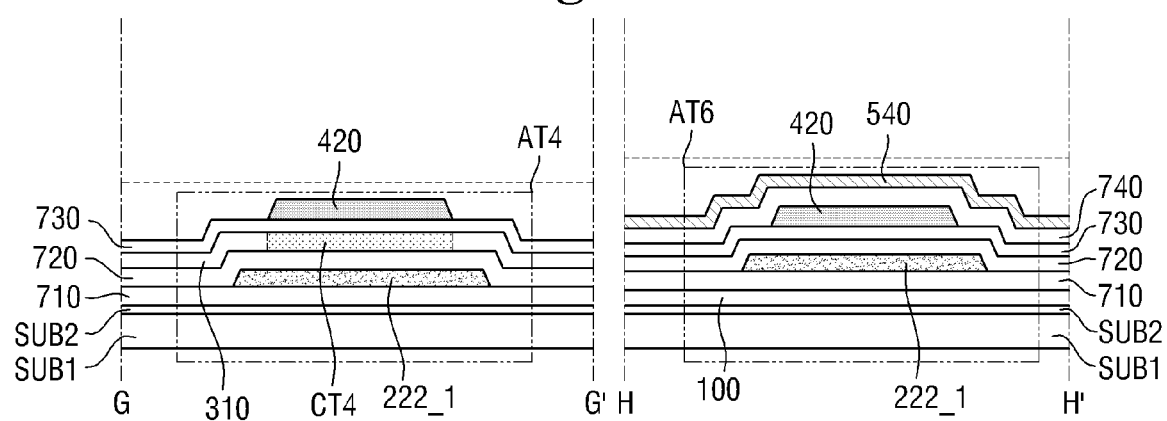
FIG. 12 is a cross-sectional view taken along lines G-G' and H-H' of FIG. 10.

FIG. 10 is a layout diagram of a first conductive layer and a second conductive layer according to another exemplary embodiment. FIG. 11 is a cross-sectional view taken along lines E-E' and F-F' of FIG. 10. FIG. 12 is a cross-sectional view taken along lines G-G' and H-H' of FIG. 10.

Referring to FIGS. 10 to 12, the present exemplary embodiment is different from the exemplary embodiment described with reference to FIG. 4 in that a first conductive layer 200_1 includes a first light emission control line 221_1 and a second light emission control line 222_1, a second scan line 410 overlaps the first light emission control line 221_1, and a third scan line 420 overlaps the second light emission control line 222_1.

For example, the first conductive layer 200_1 may include the first light emission control line 221_1 and the second light emission control line 222_1 as well as a first scan line 210, a fourth scan line 230, and a gate electrode 240 of a first transistor T1. A second conductive layer 400 includes the second scan line 410, the third scan line 420, a first initialization voltage line 430, and a second initialization voltage line 440.

The second scan line 410 extends in the same direction as the first light emission control line 221_1, for example, in the row direction, and the second scan line 410 overlaps the first light emission control line 221_1. An overlapping region between the second scan line 410 and the first light emission control line 221_1 may overlap a fifth transistor T5 and a third transistor T3. Further, the third scan line 420 extends in the same direction as the second light emission control line 222_1, for example, in the row direction, and the third scan line 420 overlaps the second light emission control line 222_1. An overlapping region between the third scan line 420 and the second light emission control line 222_1 may overlap a fourth transistor T4 and a sixth transistor T6.

Accordingly, the first light emission control line 221_1 may perform a function of a gate electrode of the fifth transistor T5 in a region in which the fifth transistor T5 is located (hereinafter, referred to as a fifth transistor region AT5), and may perform a function of a lower light-shielding pattern of the third transistor T3 in a third transistor region AT3. In addition, the second light emission control line 222_1 may perform a function of a gate electrode of the sixth transistor T6 in a region in which the sixth transistor T6 is located (hereinafter, referred to as a sixth transistor region AT6), and may perform a function of a lower light-shielding pattern of the fourth transistor T4 in a fourth transistor region AT4.

In this case, a separate lower light-shielding pattern may be unnecessary, and thus a separate space for designing the separate lower light-shielding pattern may be unnecessary in one pixel. A space utilized for one pixel is reduced, and more pixels may be in the display device 1, and thus resolution may be improved. In addition, in the case of the present exemplary embodiment, the light emission control lines 221_1 and 222_1 are used as the lower light-shielding patterns of the third transistor T3 and the fourth transistor T4 that are NMOS transistors, and a light emission control line may be maintained at a low-level voltage for a long time during light emission, and thus it may be advantageous to turn-off characteristics of the third transistor T3 and the fourth transistor T4. Accordingly, an occurrence of a leakage current may be prevented or reduced, and the display device 1 may be more stably driven.

Figure 13:
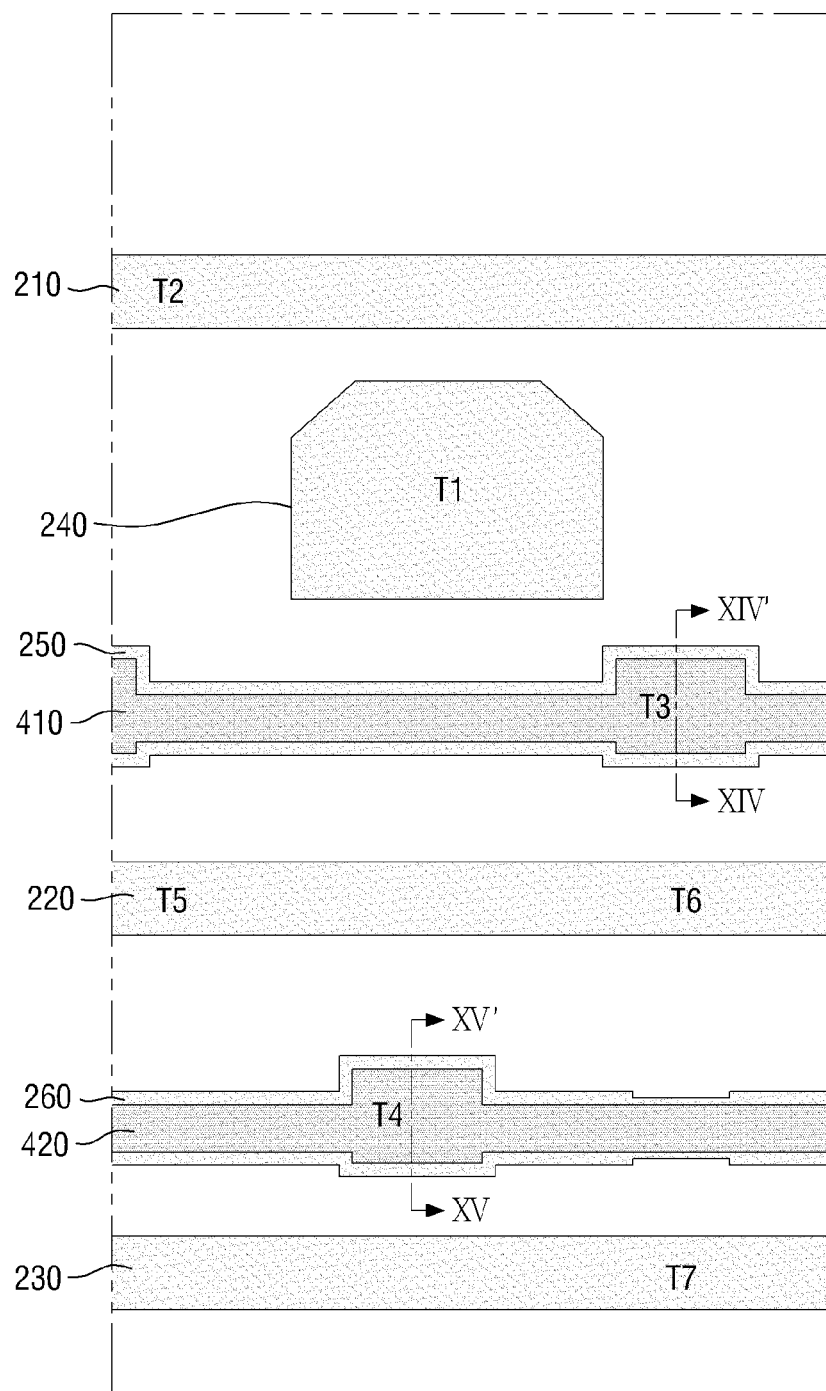
FIG. 13 is a layout diagram of a first conductive layer and a second conductive layer according to an exemplary embodiment.
Figure 14:
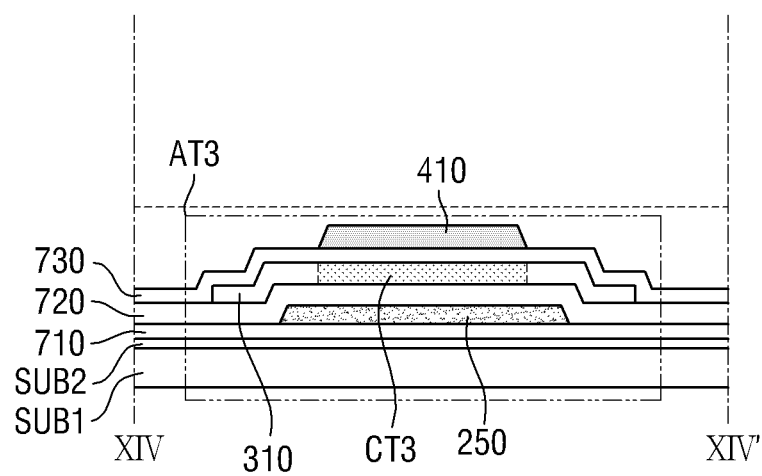
FIG. 14 is a cross-sectional view taken along line XIV-XIV' of FIG. 13.
Figure 15:
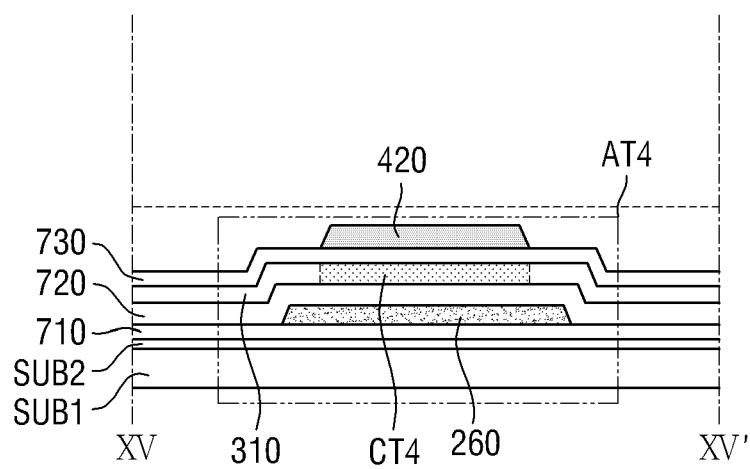
FIG. 15 is a cross-sectional view taken along line XV-XV' of FIG. 13.

FIG. 13 is a layout diagram of a first conductive layer and a second conductive layer according to still another exemplary embodiment. FIG. 14 is a cross-sectional view taken along line XIV-XIV' of FIG. 13. FIG. 15 is a cross-sectional view taken along line XV-XV' of FIG. 13.

Referring to FIGS. 13 to 15, the present exemplary embodiment is different from the exemplary embodiment described with reference to FIG. 4 in that a first conductive layer 200_2 includes a first initialization voltage line 250 and a second initialization voltage line 260, a second scan line 410 overlaps the first initialization voltage line 250, and a third scan line 420 overlaps the second initialization voltage line 260.

For example, the first conductive layer 200_2 includes the first initialization voltage line 250 and the second initialization voltage line 260 as well as a first scan line 210, a light emission control line 220, a fourth scan line 230, and a gate electrode 240 of a first transistor T1. A second conductive layer 400_2 includes the second scan line 410 and the third scan line 420. For example, the first initialization voltage line 250 and the second initialization voltage line 260 may be in the same layer as the first scan line 210, the light emission control line 220, the fourth scan line 230, and the gate electrode 240 of the first transistor T1.

The second scan line 410 extends in the same direction as the first initialization voltage line 250, for example, in the row direction, and the second scan line 410 overlaps the first initialization voltage line 250. An overlapping region between the second scan line 410 and the first initialization voltage line 250 may overlap a third transistor T3. Further, the third scan line 420 extends in the same direction as the second initialization voltage line 260, for example, in the row direction, and the third scan line 420 overlaps the second initialization voltage line 260. An overlapping region between the third scan line 420 and the second initialization voltage line 260 may overlap a fourth transistor T4.

Accordingly, the first initialization voltage line 250 and the second initialization voltage line 260, through which an initialization voltage is transmitted from an external power source, may perform a function of a lower light-shielding pattern. For example, the first initialization voltage line 250 may perform a function of a lower light-shielding pattern of the third transistor T3 in a third transistor region AT3, and the second initialization voltage line 260 may perform a function of a lower light-shielding pattern of the fourth transistor T4 in a fourth transistor region AT4.

In this case, a separate lower light-shielding pattern may be unnecessary, and thus a separate space for designing the separate lower light-shielding pattern may be unnecessary in one pixel. A space utilized for one pixel is reduced, and more pixels may be in the display device 1, and thus resolution may be improved.

While some of the embodiments of the present disclosure have been described with reference to the accompanying drawings, it will be understood by those skilled in the art that various modifications can be made without departing from the spirit and scope of the present disclosure as defined by the appended claims, and equivalents thereof. Therefore, the above-described embodiments should be considered in a descriptive sense only and not for purposes of limitation.

What is claimed is:

1. A display device comprising:
   a substrate;
   a first semiconductor layer on a surface of the substrate;
   a first scan line above the first semiconductor layer;
   a second semiconductor layer above the first scan line;
   a second scan line above the second semiconductor layer;
   a first transistor configured to control a driving current flowing from a first electrode of the first transistor to a second electrode of the first transistor according to a voltage applied to a gate electrode of the first transistor;
   a light-emitting element electrically coupled to the second electrode of the first transistor and configured to emit light according to the driving current;
   a second transistor electrically coupled to the first electrode of the first transistor and configured to transfer a data voltage;
   the first semiconductor layer forming channel regions of the first transistor and the second transistor;
   the first scan line electrically coupled to a gate electrode of the second transistor and extending in a first direction;
   a third transistor configured to supply a voltage to the gate electrode of the first transistor, and including a first electrode electrically coupled to the second electrode of the first transistor and a second electrode electrically coupled to the gate electrode of the first transistor;
   the second semiconductor layer forming a channel region of the third transistor; and
   the second scan line electrically coupled to a gate electrode of the third transistor and extending in the first direction,
   wherein the second scan line overlaps the first scan line in a second direction perpendicular to the surface of the substrate, wherein the channel region of the third transistor overlaps between the first scan line and the second scan line in the second direction, wherein the first scan line is configured to supply a first scan signal to the gate electrode of the second transistor, and the second scan line is configured to supply a second scan signal to the gate electrode of the third transistor, the second scan signal being different from the first scan signal, and wherein the first and second scan lines are separately coupled to a scan driver to allow the first scan signal and the second scan signal to be independently supplied to the respective gate electrodes of the second and third transistors.

2. The display device of claim 1, wherein the first transistor and the second transistor are p-type metal-oxide-semiconductor (PMOS) transistors, and the third transistor is an n-type metal-oxide-semiconductor (NMOS) transistor.

3. The display device of claim 2, wherein the first semiconductor layer comprises polycrystalline silicon, and
the second semiconductor layer comprises an oxide semiconductor.

4. The display device of claim 1, wherein the second transistor includes a channel region overlapping the first scan line.

5. The display device of claim 4, wherein the channel region of the second transistor overlaps the second scan line, and the first scan line is between the channel region of the second transistor and the second scan line.

6. The display device of claim 1, wherein a width of the first scan line in a third direction perpendicular to the first and second directions is greater than a width of the second scan line in the third direction.

7. The display device of claim 6, wherein the entire second scan line overlaps the first scan line.

8. The display device of claim 1, further comprising:
a fourth transistor including a first electrode electrically coupled to the second electrode of the third transistor;
a third scan line electrically coupled to a gate electrode of the fourth transistor;
a fifth transistor electrically coupled to a second electrode of the fourth transistor; and
a fourth scan line electrically coupled to a gate electrode of the fifth transistor,
wherein the third scan line and the fourth scan line extend in the first direction and overlap each other.

9. The display device of claim 8, wherein the fourth transistor includes a channel region overlapping the third scan line, and the channel region of the fourth transistor overlaps the fourth scan line.

10. The display device of claim 9, wherein the channel region of the fourth transistor is between the third scan line and the fourth scan line.

11. The display device of claim 10, wherein the fifth transistor includes a channel region overlapping the fourth scan line.

12. The display device of claim 8, wherein the fourth transistor is an NMOS transistor, and
the fifth transistor is a PMOS transistor.

* * * * *